(12) United States Patent
Toh et al.

(10) Patent No.: US 10,594,065 B2
(45) Date of Patent: Mar. 17, 2020

(54) BOARD EDGE CONNECTOR

(71) Applicant: Molex, LLC, Lisle, IL (US)

(72) Inventors: Ser Kiat Toh, Singapore (SG);
Weng-Heng Liong, Singapore (SG)

(73) Assignee: Molex, LLC, Lisle, IL (US)

( * ) Notice: Subject to any disclaimer, the term of this patent is extended or adjusted under 35 U.S.C. 154(b) by 0 days.

(21) Appl. No.: 16/144,680

(22) Filed: Sep. 27, 2018

(65) Prior Publication Data

US 2019/0097336 A1 Mar. 28, 2019

Related U.S. Application Data

(60) Provisional application No. 62/564,363, filed on Sep. 28, 2017.

(51) Int. Cl.

| | |
|---|---|
| *H01R 12/72* | (2011.01) |
| *H01R 13/6587* | (2011.01) |
| *H01R 13/514* | (2006.01) |
| *H01R 13/405* | (2006.01) |
| *H05K 1/11* | (2006.01) |
| *H01R 13/6471* | (2011.01) |

(52) U.S. Cl.
CPC ........ *H01R 12/721* (2013.01); *H01R 13/405* (2013.01); *H01R 13/514* (2013.01); *H01R 13/6587* (2013.01); *H01R 12/722* (2013.01); *H01R 13/6471* (2013.01); *H05K 1/117* (2013.01)

(58) Field of Classification Search
CPC . H01R 13/646; H01R 13/6471; H01R 12/724
USPC .................................................. 439/629, 630
See application file for complete search history.

(56) References Cited

U.S. PATENT DOCUMENTS

| | | | |
|---|---|---|---|
| 7,798,852 B2 | 9/2010 | Laurx et al. | |
| 7,909,652 B2* | 3/2011 | Yang | H01R 12/714 439/660 |
| 8,425,257 B2* | 4/2013 | Gao | H01R 12/721 439/630 |
| 8,771,018 B2* | 7/2014 | McGrath | H01R 12/72 439/630 |
| 8,992,262 B2* | 3/2015 | Pang | H01R 13/6471 439/626 |

(Continued)

FOREIGN PATENT DOCUMENTS

| | | |
|---|---|---|
| CN | 1180950 A | 5/1998 |
| CN | 206422325 U | 8/2017 |
| JP | 2000-214214 A | 8/2000 |

*Primary Examiner* — Hien D Vu
(74) *Attorney, Agent, or Firm* — Molex, LLC

(57) ABSTRACT

The present disclosure provides a board edge connector. The board edge connector includes an insulating housing and a plurality of terminal groups. The insulating housing includes a supporting portion. Each of the terminal groups includes a plurality of terminals. Each terminal includes a holding portion, a resilient contact portion, a tail portion and a connecting portion. The terminal of at least one of the terminal groups has a longer connecting portion than the rest of the terminal groups. The longer connecting portion includes a supported portion extending in a front and back direction. The supporting portion includes a plurality of supporting grooves disposed thereon. The supported portion of the terminal is disposed on and supported by the supporting grooves.

17 Claims, 32 Drawing Sheets

(56) References Cited

U.S. PATENT DOCUMENTS

| | | | |
|---|---|---|---|
| 9,368,927 B2* | 6/2016 | Kawamura | H01R 24/60 |
| 9,692,183 B2* | 6/2017 | Phillips | H01R 13/6471 |
| 9,742,118 B2* | 8/2017 | Goh | H01R 13/6471 |
| 10,283,885 B2* | 5/2019 | Little | H01R 24/60 |
| 2016/0181713 A1 | 6/2016 | Peloza et al. | |

* cited by examiner

BOARD EDGE CONNECTOR

RELATED APPLICATIONS

This application claims priority to U.S. Provisional Application 62/564363, filed Sep. 28, 2017, which is incorporated herein by reference in its entirety.

TECHNICAL FIELD

The present disclosure relates to a board edge connector, and more particularly, to a board edge connector including four terminal groups.

DISCUSSION OF THE BACKGROUND

Various means of electronic transmission are known in the art. Most, if not all, of these means suffer from inherent speed limitations, examples of which include the upper frequency limit and the propagation delay (the time required for a signal to physically transmit from one point to another within the system). Such means of electronic transmission are inherently limited in their electronic performance primarily by their structure, and secondarily by their material composition. Conventionally, an edge connector is used as a direct type connector, in which an edge of a substrate, such as a printed circuit board, is directly inserted into the connector.

This Discussion of the Background section is for background information only. The statements in this Discussion of the Background are not an admission that the subject matter disclosed in this section constitutes a prior art to the present disclosure, and no part of this section may be used as an admission that any part of this application, including this Discussion of the Background section, constitutes prior art to the present disclosure.

SUMMARY

One aspect of the present disclosure provides a board edge connector. The board edge connector includes an insulating housing and a plurality of terminal groups. The insulating housing includes a front surface, a bottom surface, a board edge receiving slot and a supporting portion. The front surface serves as a mating end located at a front of the insulating housing. The bottom surface serves as a mounting end. The board edge receiving slot has an opening toward the mating end. The plurality of terminal groups is retained in the insulating housing. Each of the terminal groups includes a plurality of terminals. The terminals of the each of the terminal groups are arranged in a row extending in a left to right direction. Each of the terminals includes a holding portion, a resilient contact portion, a tail portion and a connecting portion. The resilient contact portion extends from the holding portion and into the board edge receiving slot. The tail portion extends from the holding portion to and out of the mounting end. The connecting portion is between the holding portion and the tail portion. The terminals of at least one of the terminal groups have a longer connecting portion than the terminals of the rest of the terminal groups. The longer connecting portion includes a supported portion extending in a front and back direction. The supporting portion includes a plurality of supporting grooves disposed thereon, wherein the supported portion of the terminal is disposed on and supported by the supporting groove.

In some embodiments, the supporting groove includes a projection rib, at a rear end of the supporting groove, configured to support the supported portion of the terminal.

In some embodiments, the terminal groups include a first terminal group, a second terminal group, a third terminal group and a fourth terminal group. The first terminal group is in front of the second terminal group in the front and back direction. The third terminal group superposes the second terminal group. The fourth terminal group superposes the third terminal group. The resilient contact portions of the terminals of the first terminal group and the terminals of the fourth terminal group are at the front of the board edge receiving slot, and face opposed to each other in an up and down direction. The resilient contact portions of the terminals of the second terminal group and the terminals of the third terminal group are at a back of the board edge receiving slot, and face opposed to each other in the up and down direction. The tail portions of the terminals of the first terminal group, the second terminal group, the third terminal group and the fourth terminal group are arranged in order from the front to the back of the mounting end.

In some embodiments, the terminals of the third terminal group and the terminals of the fourth terminal group include the longer connecting portion including the supported portion. The supporting portion is a first supporting portion. The insulating housing further includes a second supporting portion. The first supporting portion and the second supporting portion are configured to support the supported portions of the terminals of the third terminal group and the fourth terminal group.

In some embodiments, each of the first terminal group, the second terminal group, the third terminal group and the fourth terminal group includes an insulating member. Each of the holding portions of the terminals of each of the first terminal group, the second terminal group, the third terminal group and the fourth terminal group is insert molded into the insulating member.

In some embodiments, the insulating housing includes an upper housing and a lower housing installed and fixed to each other. The insulating member of the first terminal group is fixed to the lower housing. The insulating member of the second terminal group is fixed to the lower housing and disposed at the back of the first terminal group. The insulating member of the third terminal group superposes the insulating member of the second terminal group and is fixed to the lower housing. The insulating member of the fourth terminal group is fixed to the upper housing and superposes the insulating member of the third terminal group.

In some embodiments, the insulating member of the first terminal group is a first insulating member, the insulating member of the second terminal group is a second insulating member, the insulating member of the third terminal group is a third insulating member and the insulating member of the fourth terminal group is a fourth insulating member. The lower housing includes a receiving portion including a first post hole. The first insulating member includes a first heat stake post. The first insulating member is fixed to the receiving portion via a combination of the first post hole and the first heat stake post. The lower housing includes a raised portion including a second post hole and a third post hole. The second insulating member includes a second heat stake post and a second hole. The second insulating member is fixed to the raised portion via a combination of the second post hole and the second heat stake post. The third insulating member includes a third heat stake post. The third insulating member is fixed to the second insulating member and the raised portion via the second hole of the second insulating member and the third post hole of the raised portion.

In some embodiments, the second insulating member includes a second positioning recess. The third insulating member includes a third positioning block. The third insulating member aligns to the second insulating member by aligning the third positioning block to the second positioning recess.

In some embodiments, the third insulating member further includes a third positioning hole, and the fourth insulating member includes a fourth positioning block. The fourth insulating member aligns to the third insulating member by aligning the fourth position block to the third position hole.

In some embodiments, the upper housing includes an upper post hole. The fourth insulating member including a fourth stake post. The fourth insulating member is fixed to the upper housing via a combination of the upper post hole and the fourth stake post.

In some embodiments, the tail portion includes a surface mounting technology (SMT) tail portion.

Another aspect of the present disclosure provides a board edge connector. The board edge connector includes an insulating housing and a plurality of terminal groups. The insulating housing includes a front surface, a bottom surface, a board edge receiving slot and a supporting portion. The front surface serves as a mating end located at a front of the insulating housing. The bottom surface serves as a mounting end. The board edge receiving slot has an opening toward the mating end. Each of the terminal groups includes a plurality of terminals. The terminals of the each of the terminal groups are arranged in a row extending in a left to right direction. Each of the terminals includes a holding portion, a resilient contact portion, a tail portion and a connecting portion. The resilient contact portion extends from the holding portion and into the board edge receiving slot. The tail portion extends from the holding portion to and out of the mounting end. The connecting portion is between the holding portion and the tail portion. At least one of the terminal groups serves as a high frequency terminal group configured to transmit a high frequency signal, and at least one of the terminal groups serves as a low frequency terminal group configured to transmit a non-high frequency signal. The high frequency terminal group includes a plurality of differential pairs of signal terminals and a plurality of ground terminals. The differential pairs and the ground terminals are arranged in an alternating manner. The resilient contact portions of the high frequency terminal group are arranged in a pattern of GGSSGG, where a portion which transmits a reference ground is indicated by G and a portion which transmits the high frequency signal is indicated by S.

In some embodiments, the holding portion of each of the ground terminals is wider than that of the signal terminals.

In some embodiments, wherein the tail portions of the high frequency terminal group are arranged in the pattern.

In some embodiments, the terminal groups include a first terminal group, a second terminal group, a third terminal group and a fourth terminal group, wherein two of the terminal groups serve as the high frequency terminal group, and the other two of the terminal groups serve as the low frequency terminal group.

In some embodiments, the first terminal group is in front of the second terminal group in a front and back direction. The first terminal group and the second terminal group are closer to the mounting end than the third terminal group and the fourth terminal group. The third terminal group superposes the second terminal group. The fourth terminal group superposes the third terminal group. The resilient contact portions of the terminals of the first terminal group and the terminals of the fourth terminal group are at the front of the board edge receiving slot, and face opposed to each other in an up and down direction. The resilient contact portions of the terminals of the first terminal group are below the resilient contact portions of the terminals of the fourth terminal group. The resilient contact portions of the terminals of the second terminal group and the terminals of the third terminal group are at a back of the board edge receiving slot, and face opposed to each other in the up and down direction. The resilient contact portions of the terminals of the second terminal group are below the resilient contact portions of the terminals of the third terminal group. The first terminal group and the second terminal group serve as the high frequency terminal group, and the third terminal group and the fourth terminal group serve as the low frequency terminal group.

In some embodiments, the resilient contact portion of the fourth terminal group is arranged offset, in a left and right direction, from the resilient contact portion of the first terminal group. The resilient contact portion of the third terminal group is arranged offset, in the left and right direction, from the resilient contact portion of the second terminal group.

In some embodiments, the resilient contact portion of the fourth terminal group is between the resilient contact portions of the first terminal group. The resilient contact portion of the third terminal group is between the resilient contact portions of the second terminal group.

In some embodiments, each of the first terminal group, the second terminal group, the third terminal group and the fourth terminal group includes an insulating member. Each of the holding portions of the terminals of each of the first terminal group, the second terminal group, the third terminal group and the fourth terminal group is insert molded into the insulating member.

In some embodiments, the insulating housing includes an upper housing and a lower housing installed and fixed to each other. The insulating member of the first terminal group is fixed to the lower housing. The insulating member of the second terminal group is fixed to the lower housing and at the back of the first terminal group. The insulating member of the third terminal group superposes the insulating member of the second terminal group and is fixed to the lower housing. The insulating member of the fourth terminal group is fixed to and superposes the insulating member of the third terminal group.

In some embodiments, the resilient contact portions of the first terminal group and the resilient contact portions of the first terminal group are arranged in the pattern. The pattern of the resilient contact portions of the first terminal group is arranged offset from the pattern of the resilient contact portions of the second terminal group.

In some embodiments, when the resilient contact portion of the first terminal group is G, the resilient contact portion of the second terminal group is S; and when the resilient contact portion of the first terminal group is S, the resilient contact portion of the second terminal group is G.

In some embodiments, wherein the first terminal group includes a first terminal, and the second terminal group includes a second terminal, wherein a front section of the second terminal is over a rear section of the first terminal.

Another aspect of the present disclosure provides a board edge connector. The board edge connector includes an insulating housing, a first terminal group, a second terminal group, a third terminal group, a fourth terminal group and a first supporting portion. The insulating housing includes a front surface, a back surface, a top surface and a bottom surface. The front surface serves as a mating end of the board edge connector. The back surface faces opposite to the front surface. The bottom surface, facing opposite to the top surface, serves as a mounting end of the board edge connector. The board edge receiving slot has an opening toward the mating end. The first supporting portion includes a plurality of first supporting grooves. The first terminal group, retained in the insulating housing, includes a plurality of first terminals arranged in a row extending in a left to right direction. The first terminal includes a first resilient contact portion and a first surface mounting technology (SMT) tail portion. The first resilient contact portion extends into the board edge receiving slot. The second terminal group, retained in the insulating housing, includes a plurality of second terminals arranged in a row extending in the left to right direction. The second terminal includes a second resilient contact portion and a second SMT tail portion. The second resilient contact portion extends into the board edge receiving slot. The third terminal group, retained in the insulating housing, includes a plurality of third terminals arranged in a row extending in the left to right direction. The third terminal group includes a third holding portion, a third resilient contact portion, a third SMT tail portion and a third connecting portion. The third resilient contact portion extends from the third holding portion and into the board edge receiving slot. The third connecting portion is configured to connect the third holding portion to the third SMT tail portion. The fourth terminal group, retained in the insulating housing, includes a plurality of fourth terminals arranged in a row extending in the left to right direction. The fourth terminal group includes a fourth holding portion, a fourth resilient contact portion, a fourth SMT tail portion and a fourth connecting portion. The fourth resilient contact portion extends from the fourth holding portion and into the board edge receiving slot. The fourth connecting portion is configured to connect the fourth holding portion to the fourth SMT tail portion. At least one of the third connecting portion and the fourth connecting portion includes a supported portion. The supported portion extends in a front and back direction. The supported portion is on and supported by the first supporting groove. The first resilient contact portion and the fourth resilient contact portion are closer to the front surface than the second resilient contact portion and the third resilient contact portion. The first SMT tail portion, the second SMT tail portion, the third SMT tail portion and the fourth SMT tail portion extend out of the mounting end. The fourth SMT tail portion is closer to the back surface than the first SMT tail portion, the second SMT tail portion and the third SMT tail portion. The third SMT tail portion is closer to the back surface than the first SMT tail portion and the second SMT tail portion, and the second SMT tail portion is closer to the back surface than the first SMT tail portion.

In some embodiments, the first supporting groove includes a projection rib at a rear end of the first supporting groove. The projection rib is configured to support the supported portion.

In some embodiments, the first terminal group is in front of the second terminal group in the front and back direction. The third terminal group superposes the second terminal group in an up and down direction. The fourth terminal group superposes the third terminal group in the up and down direction. The first resilient contact portion and the fourth resilient contact portion face opposed to each other in the up and down direction. The second resilient contact portion and the third resilient contact portion face opposed to each other in the up and down direction.

In some embodiments, the insulating housing further includes a second supporting portion including a second supporting groove. The third connecting portion includes a third supported portion which is supported by the first supporting groove. The fourth connecting portion includes a fourth supported portion which is supported by the second supporting groove.

In some embodiments, each of the first supporting groove and the second supporting groove includes a projection rib. The projection rib of the first supporting groove is configured to support the third supported portion. The projection rib of the second supporting groove is configured to support the fourth supported portion.

In some embodiments, the insulating housing includes an upper housing configured to retain the fourth terminal group, and a lower housing configured to retain the first terminal group, the second terminal group and the third terminal group.

In the present disclosure, with the supported portion, the third terminal and the fourth terminal are able to sit on the lower housing for better coplanarity control of the third and fourth SMT tail portions.

The foregoing has outlined rather broadly the features and technical advantages of the present disclosure in order that the detailed description of the disclosure that follows may be better understood. Additional features and technical advantages of the disclosure are described hereinafter, and form the subject of the claims of the disclosure. It should be appreciated by those skilled in the art that the concepts and specific embodiments disclosed may be utilized as a basis for modifying or designing other structures, or processes, for carrying out the purposes of the present disclosure. It should also be realized by those skilled in the art that such equivalent constructions do not depart from the spirit or scope of the disclosure as set forth in the appended claims.

BRIEF DESCRIPTION OF THE DRAWINGS

A more complete understanding of the present disclosure may be derived by referring to the detailed description and claims. The disclosure should also be understood to be connected to the figures' reference numbers, which refer to similar elements throughout the description, and:

DETAILED DESCRIPTION

Figure 1:
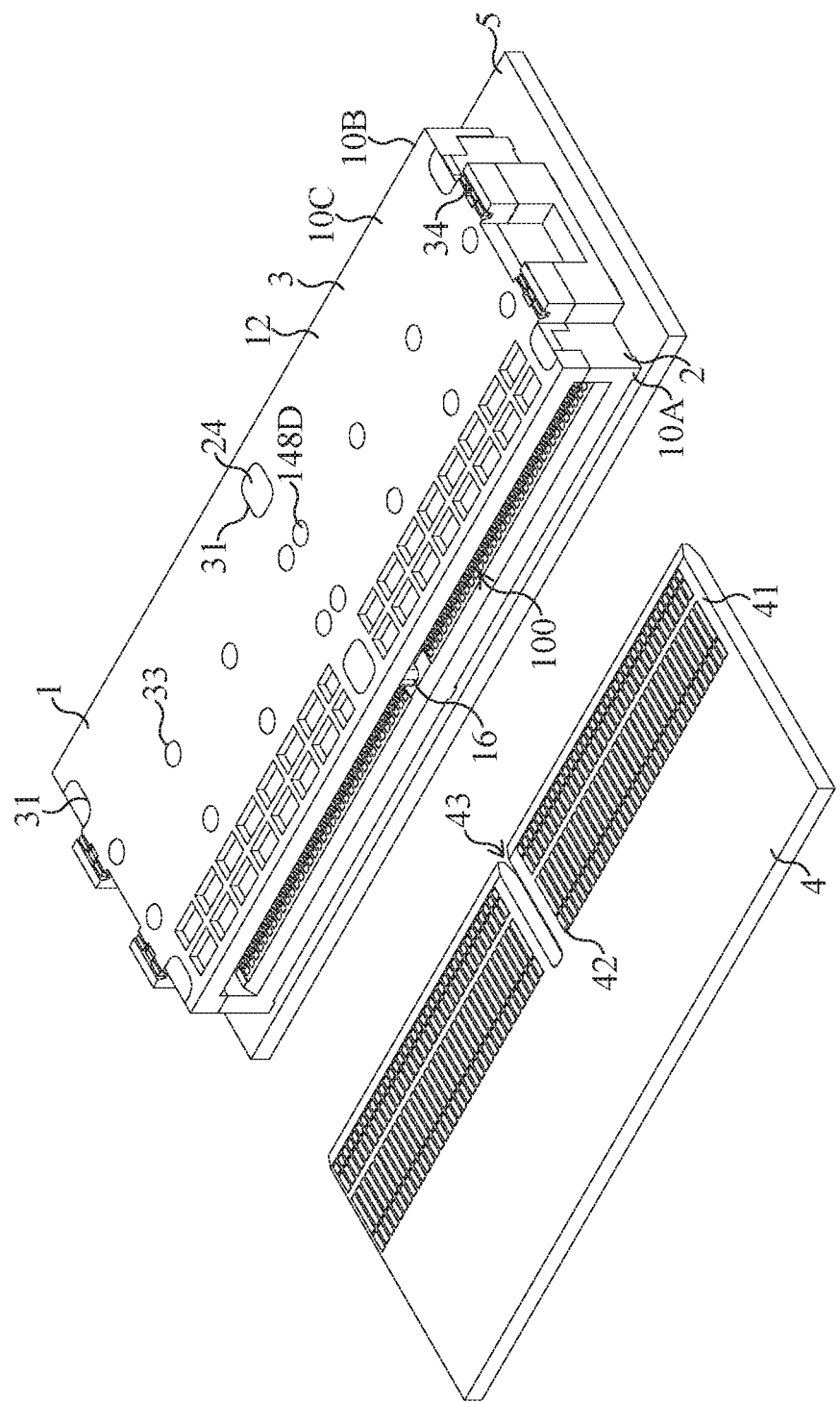
FIG. 1 is a schematic diagram illustrating a board edge connector assembled with an electrical board and a printed circuit board (PCB), in accordance with some embodiments of the present disclosure.

Embodiments, or examples, of the disclosure illustrated in the drawings are now described using specific language. It shall be understood that no limitation of the scope of the disclosure is hereby intended. Any alteration or modification of the described embodiments, and any further applications of principles described in this document, are to be considered as normally occurring to one of ordinary skill in the art to which the disclosure relates. Reference numerals may be repeated throughout the embodiments, but this does not necessarily mean that feature(s) of one embodiment apply to another embodiment, even if they share the same reference numeral.

It shall be understood that, although the terms first, second, third, etc. may be used herein to describe various elements, components, regions, layers or sections, these elements, components, regions, layers or sections are not limited by these terms. Rather, these terms are merely used to distinguish one element, component, region, layer or section from another region, layer or section. Thus, a first element, component, region, layer or section discussed below could be termed a second element, component, region, layer or section without departing from the teachings of the present inventive concept.

The terminology used herein is for the purpose of describing particular example embodiments only and is not intended to be limited to the present inventive concept. As used herein, the singular forms "a," "an" and "the" are intended to include the plural forms as well, unless the context clearly indicates otherwise. It shall be further understood that the terms "comprises" and "comprising," when used in this specification, point out the presence of stated features, integers, steps, operations, elements, or components, but do not preclude the presence or addition of one or more other features, integers, steps, operations, elements, components, or groups thereof.

Figure 2:
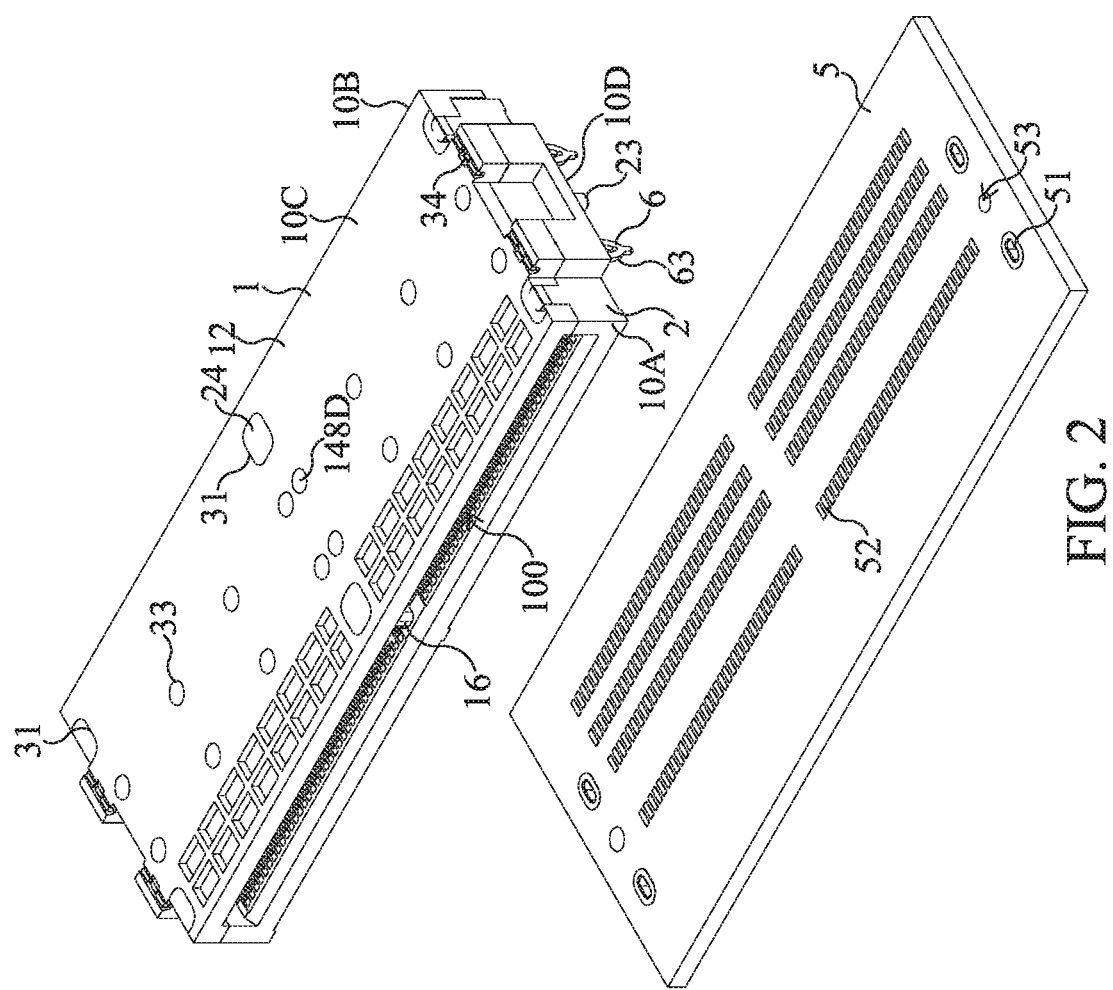
FIG. 2 is a schematic diagram illustrating an arrangement of the board edge connector and the PCB shown in FIG. 1, in accordance with some embodiments of the present disclosure.

FIG. 1 is a schematic diagram illustrating a board edge connector 1 assembled with an electrical board 4 and a printed circuit board (PCB) 5, in accordance with some embodiments of the present disclosure. FIG. 2 is a schematic diagram illustrating an arrangement of the board edge connector 1 and the PCB 5 shown in FIG. 1, in accordance with some embodiments of the present disclosure. Referring to FIGS. 1 and 2, the board edge connector 1 receives the electrical board 4 and is mounted on the PCB 5.

The board edge connector 1 includes an insulating housing 12 and a plurality of terminal groups 14A, 14B, 14C and 14D (shown in FIGS. 16 to 21) retained in the insulating housing 12.

The insulating housing 12 includes a front surface 10A, a back surface 10B, a top surface 10C and a bottom surface 10D. The front surface 10A serves as a mating end located at a front of the insulating housing 12. The bottom surface 10D serves as a mounting end. In addition, the insulation housing 12 further includes a board edge receiving slot 100. The board edge receiving slot 100 has an opening toward the mating end 10A, and receives a board edge 41 of the electrical board 4. Moreover, the insulating housing 1 includes an aligning rib 16. The aligning rib 16 is received by an aligning slit 43 of the electrical board 4.

Figure 3:
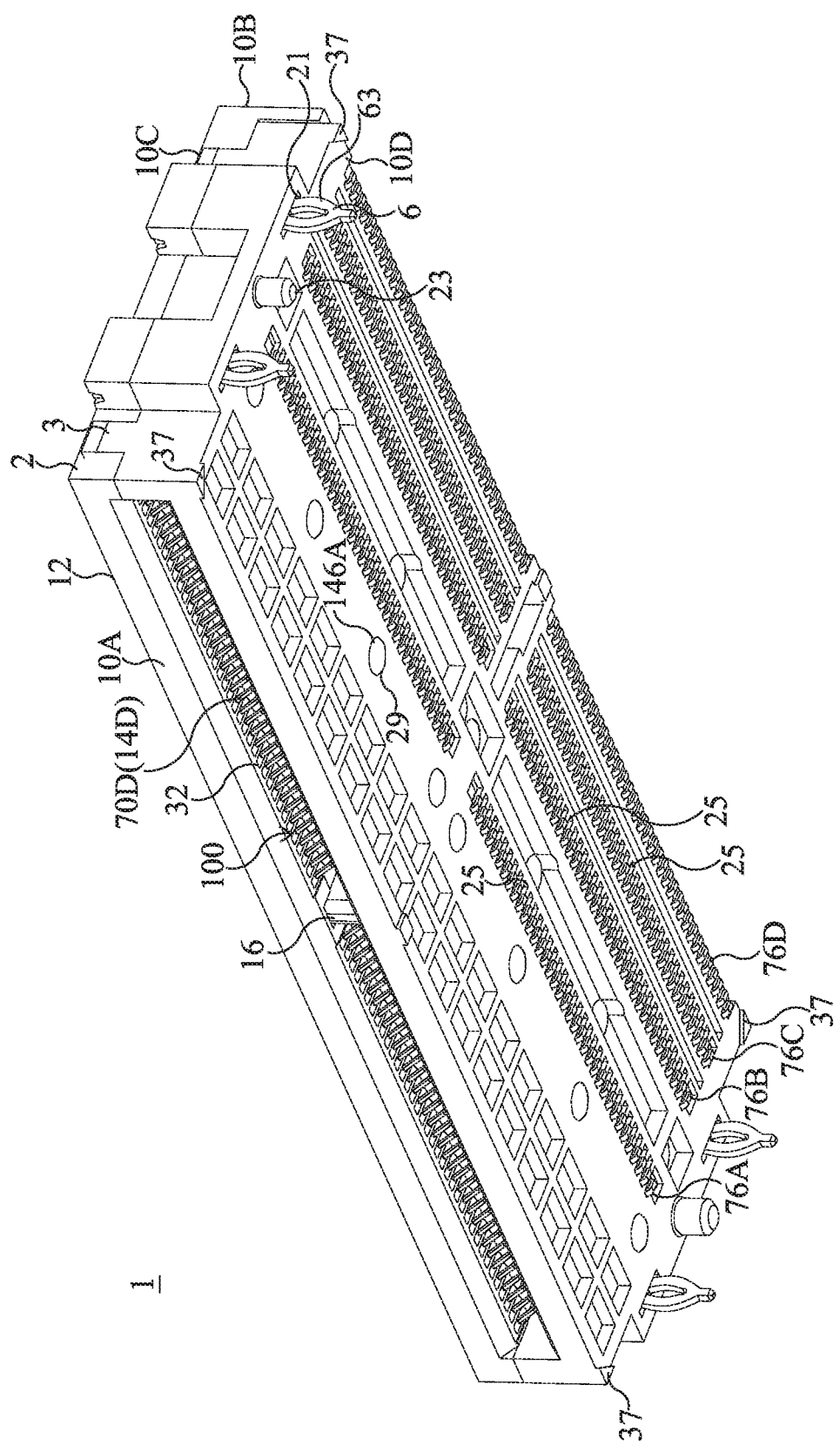
FIG. 3 is a perspective view of the board edge connector shown in FIG. 1, in accordance with some embodiments of the present disclosure.
Figure 4:
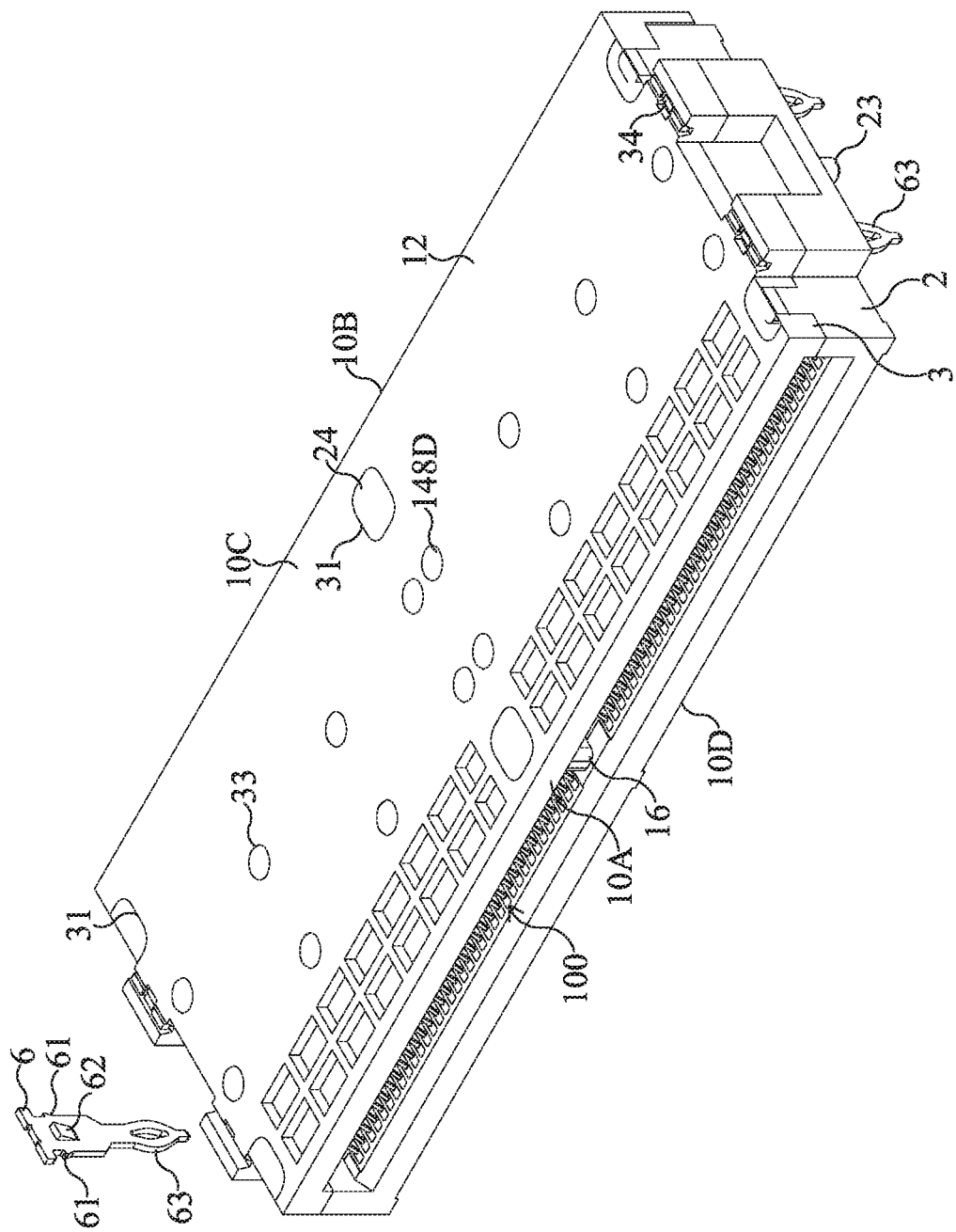
FIG. 4 is another perspective view of the board edge connector shown in FIG. 1, in accordance with some embodiments of the present disclosure.
Figure 5:
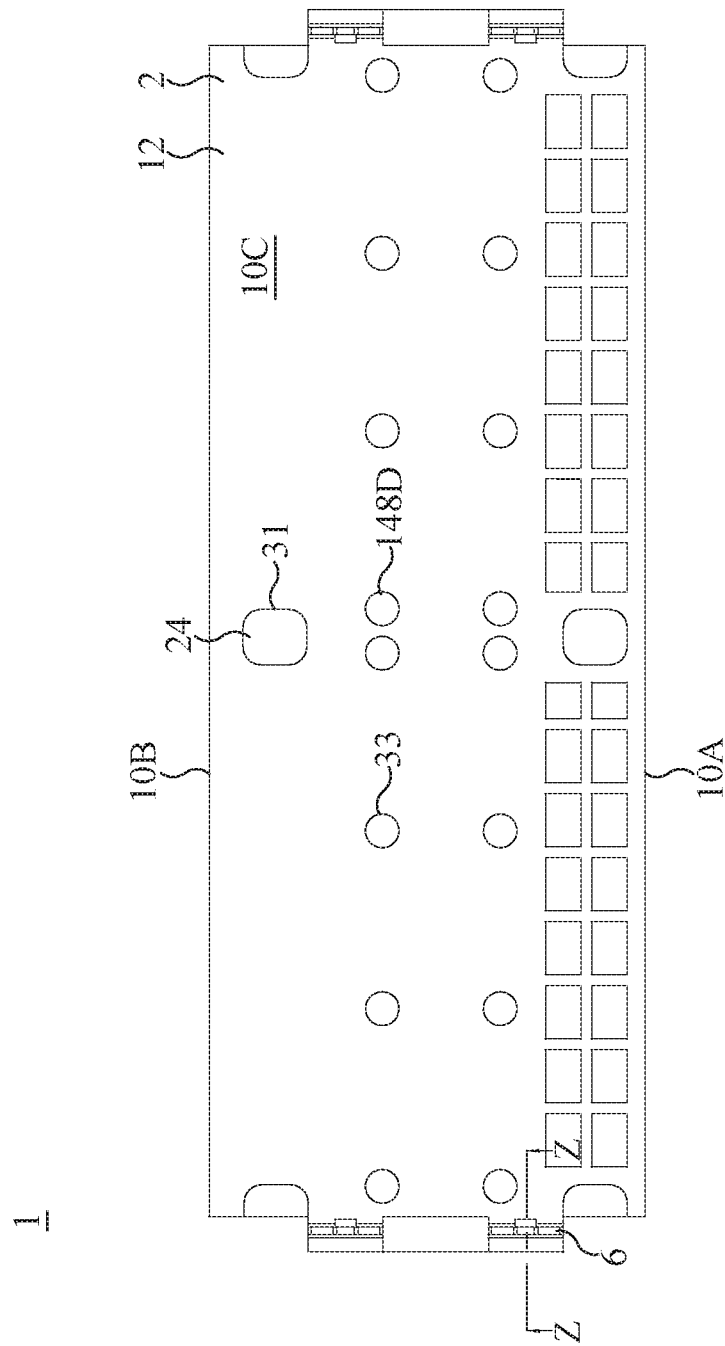
FIG. 5 is a top view of the board edge connector shown in FIG. 1, in accordance with some embodiments of the present disclosure.
Figure 6:
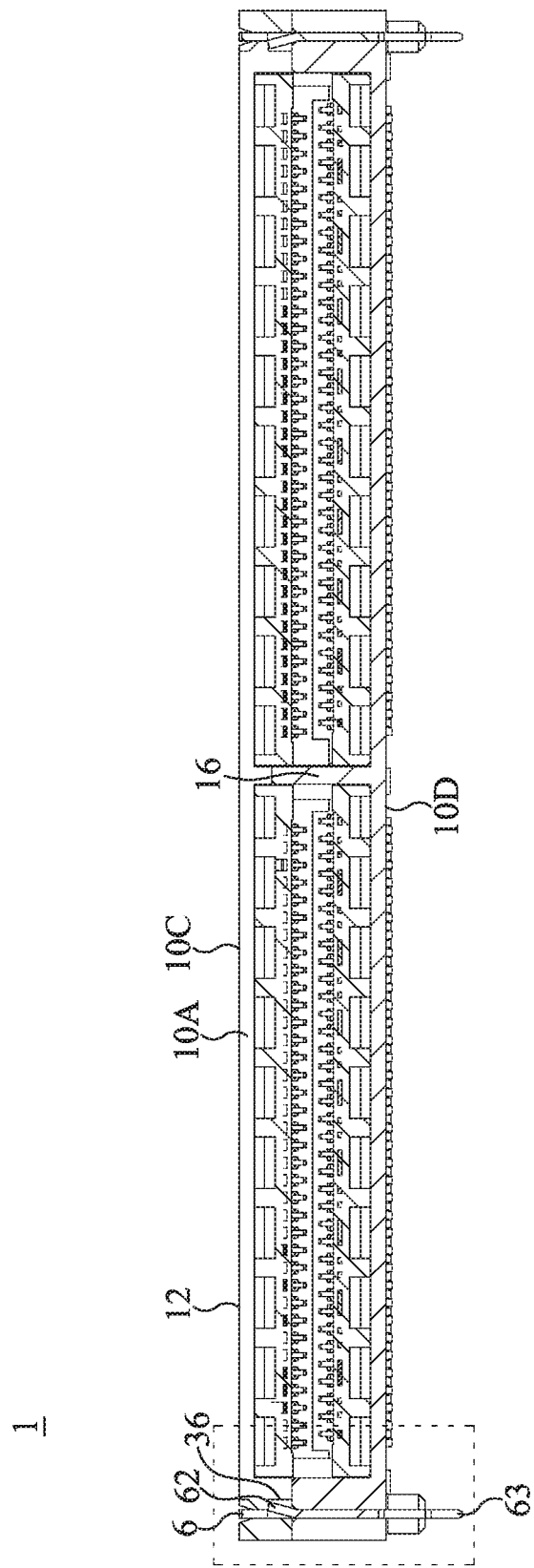
FIG. 6 is a cross-sectional diagram of the board edge connector shown in FIG. 1 along a line Z-Z, in accordance with some embodiments of the present disclosure.
Figure 7:
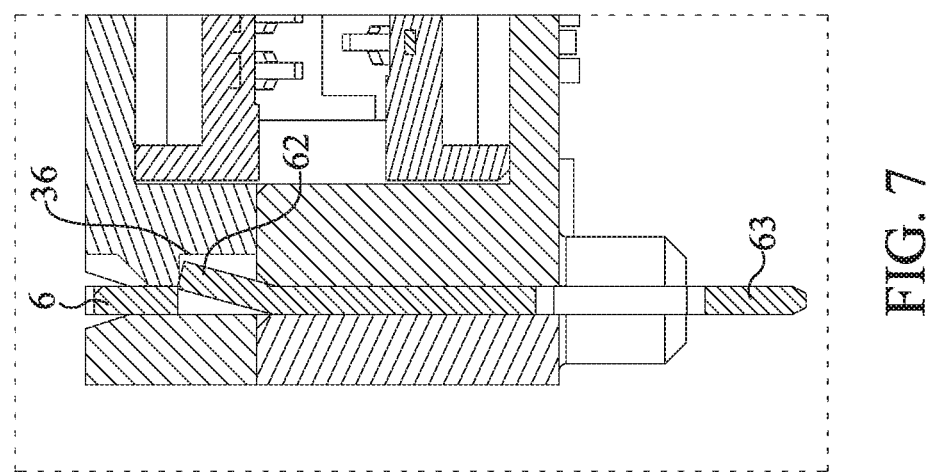
FIG. 7 is a partially enlarged schematic view of FIG. 6, in accordance with some embodiments of the present disclosure.

FIG. 3 is a perspective view of the board edge connector 1 shown in FIG. 1, in accordance with some embodiments of the present disclosure. FIG. 4 is another perspective view of the board edge connector 1 shown in FIG. 1, in accordance with some embodiments of the present disclosure. FIG. 5 is a top view of the board edge connector 1 shown in FIG. 1, in accordance with some embodiments of the present disclosure. FIG. 6 is a cross-sectional diagram of the board edge connector 1 shown in FIG. 1 along a line Z-Z, in accordance with some embodiments of the present disclosure. FIG. 7 is a partially enlarged schematic view of FIG. 6, in accordance with some embodiments of the present disclosure.

Referring to FIGS. 3 to 7, the board edge connector 1 is mounted to the PCB 5 via a board lock 6. The board lock 6 includes two barbs 61 and one locking protrusion 62. Each of the barbs 61 has interference with the insulating housing 12 in a front and back direction, such that the board lock 6 is fixed in the insulating housing 12. The locking protrusion 62 has interference with an inner sidewall 36 of the insulating housing 12 in a left and right direction, such that the board lock 6 is fixed in the insulating housing 12. In addition, the board lock 6 includes a leg 63. In an embodiment, the leg 63 includes a press fit leg with a needle-eye. In another embodiment, the leg 63 can be a fork-lock type, or any suitable type.

Figure 8:
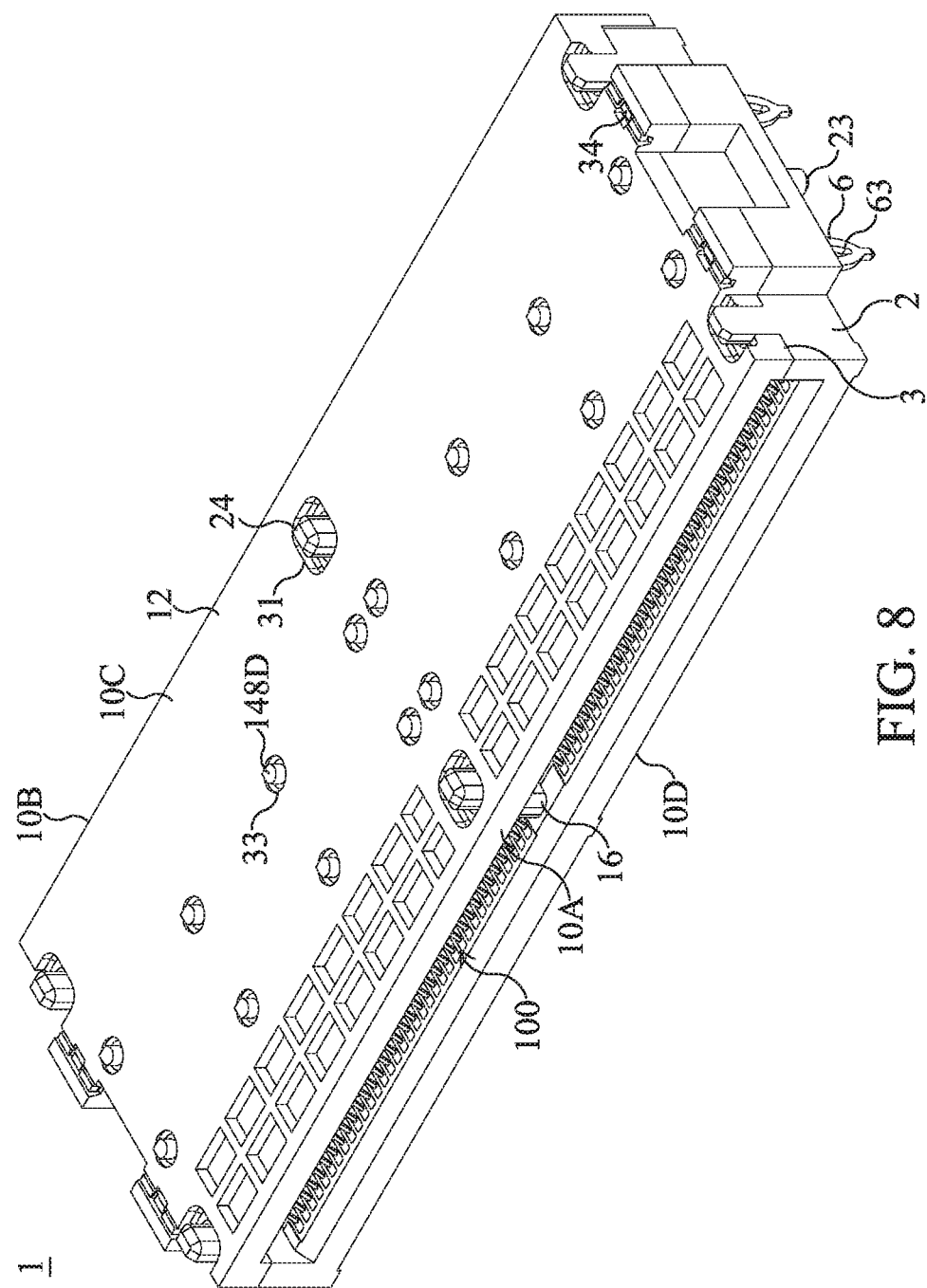
FIG. 8 is a perspective view of the board edge connector shown in FIG. 1 before heat stake, in accordance with some embodiments of the present disclosure.
Figure 9:
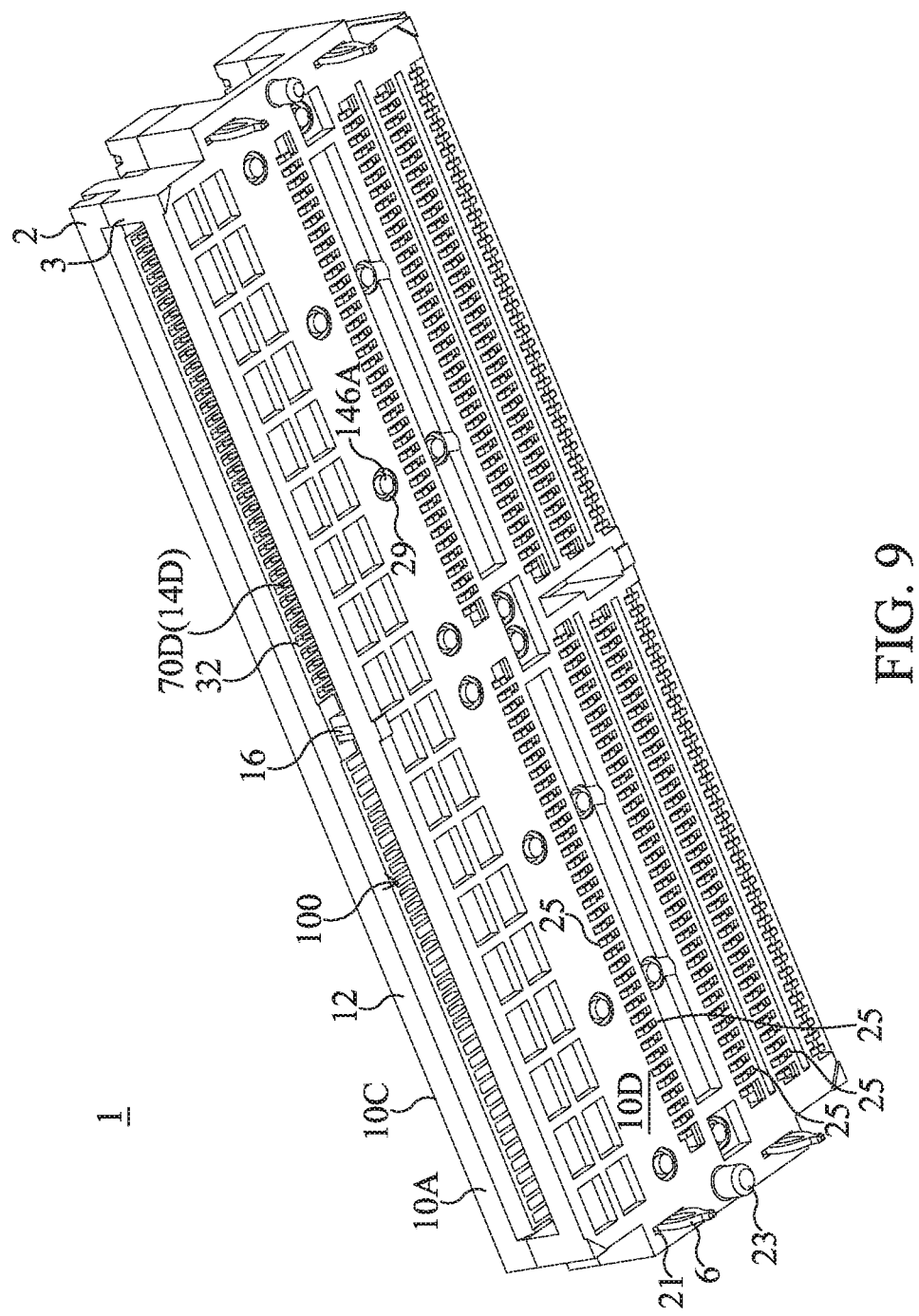
FIG. 9 is another perspective view of the board edge connector shown in FIG. 1 before heat stake, in accordance with some embodiments of the present disclosure.

FIG. 8 is a perspective view of the board edge connector 1 shown in FIG. 1 before heat stake, in accordance with some embodiments of the present disclosure. FIG. 9 is another perspective view of the board edge connector 1 shown in FIG. 1 before heat stake, in accordance with some embodiments of the present disclosure. Referring to FIGS. 8 and 9, since a heat stake operation has not yet been performed, a heat stake post, such as a heat stake post 148D as will be introduced in detail below, does not fully fill a post hole, such as a post hole 33. After the heat stake operation is performed, the heat stake post fully fills the post hole as shown in FIGS. 1 to 7. In an embodiment, a heat stake operation includes an ultrasound stake operation.

Figure 10:
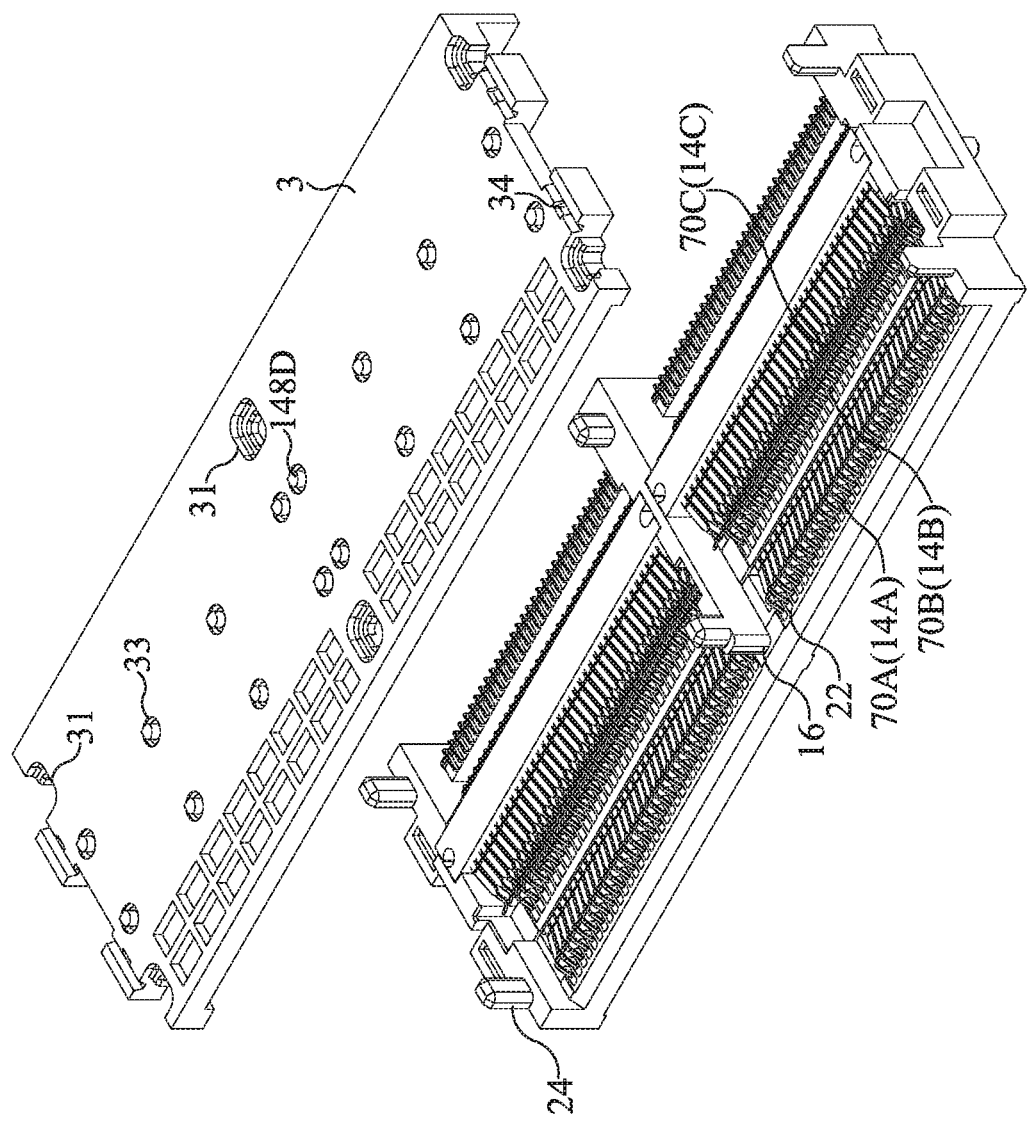
FIG. 10 is an exploded perspective view of the board edge connector shown in FIG. 8, in accordance with some embodiments of the present disclosure.
Figure 11:
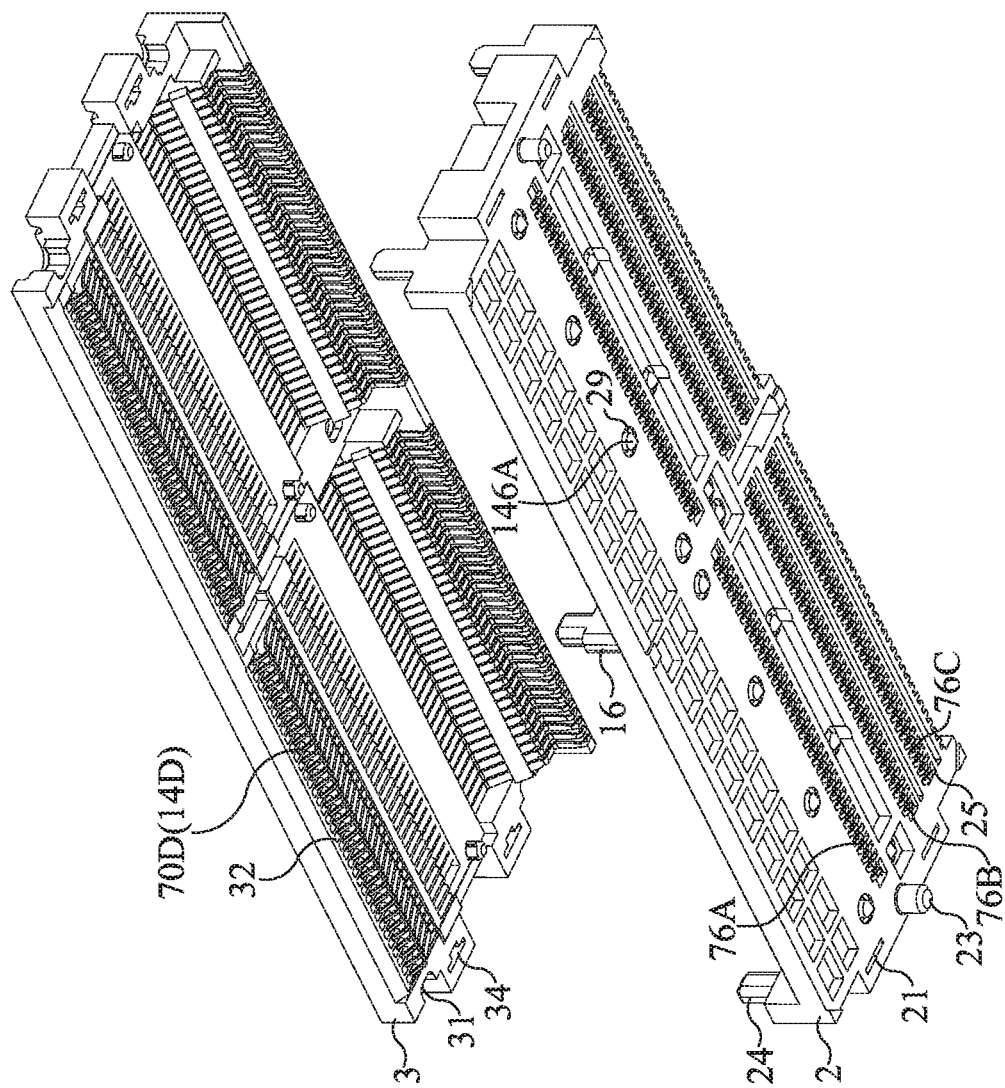
FIG. 11 is another exploded perspective view of the board edge connector shown in FIG. 8, in accordance with some embodiments of the present disclosure.

FIG. 10 is an exploded perspective view of the board edge connector 1 shown in FIG. 8, in accordance with some embodiments of the present disclosure. FIG. 11 is another exploded perspective view of the board edge connector 1 shown in FIG. 8, in accordance with some embodiments of the present disclosure. Referring to FIGS. 10 and 11, the insulating housing 12 includes an upper housing 3 and a lower housing 2 installed and fixed to each other.

The lower housing 2 includes a plurality of locking recesses 21, a plurality of studs 24 and a plurality of positioning posts 23.

The upper housing 3 includes a plurality of openings 31 and a plurality of locking recesses 34.

As previously mentioned, the lower housing 2 and the upper housing 3 are fixed to each other. The board locks 6 insert from the locking recesses 34 of the upper housing 3 through the locking recesses 21 of the lower housing 2, and the legs 63 of the board locks 6 extend out of the mounting end 10D of the insulating housing 12.

Moreover, since the leg 63 inserts into the fixing hole 51 of the PCB 5, the board edge connector 1 is fixed to the PCB 5. Additionally, the board edge connector 1 aligns to the PCB 5 by aligning each of the positioning posts 23 to a positioning hole 53 of the PCB 5. In further detail, the positioning post 23 inserts into the positioning hole 53.

Moreover, the upper housing 3 and the lower housing 2 are fixed together by inserting the stud 24 of the lower housing 2 into the opening 31 of the upper housing 3 and performing a heat stake operation on the stud 24 subsequently.

Figure 12:
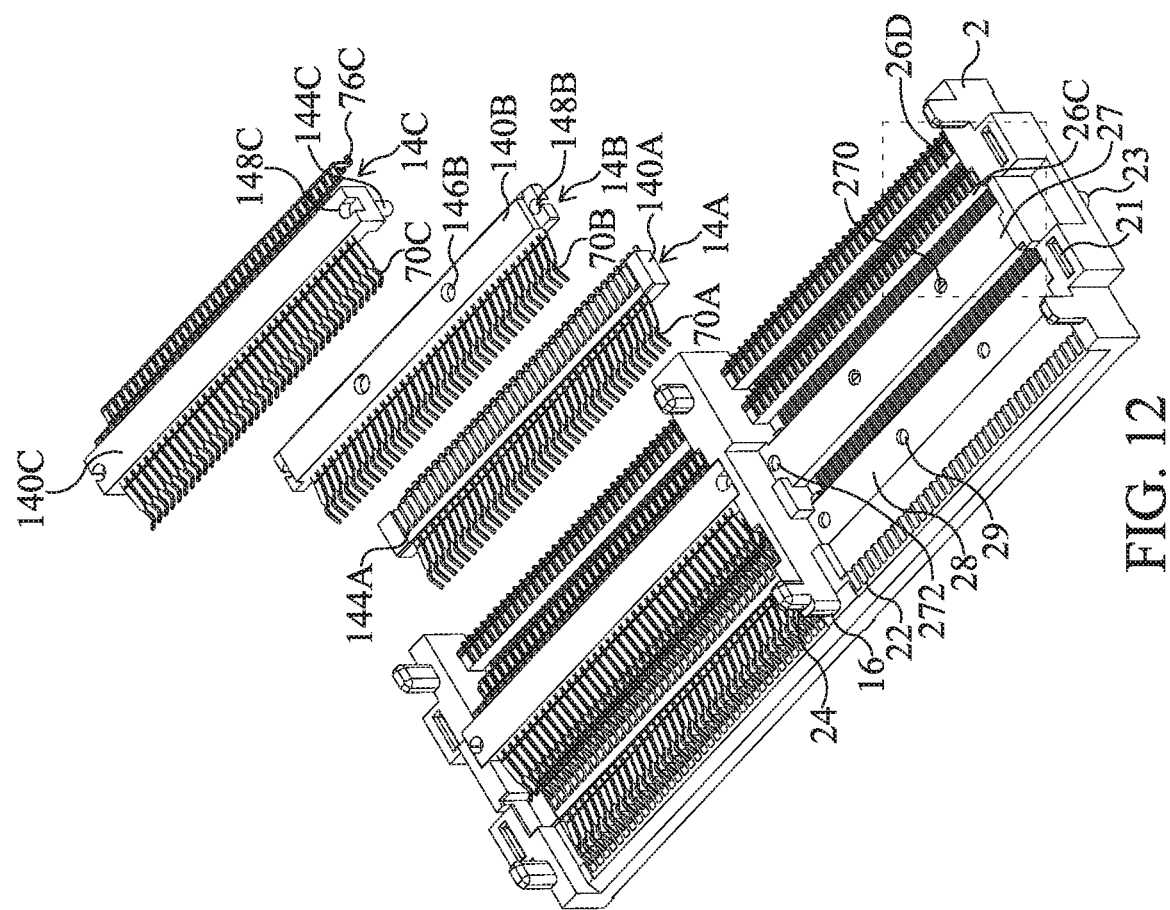
FIG. 12 is a schematic diagram illustrating an arrangement of a lower housing, a first terminal group, a second terminal group and a third terminal group, in accordance with some embodiments of the present disclosure.
Figure 13:
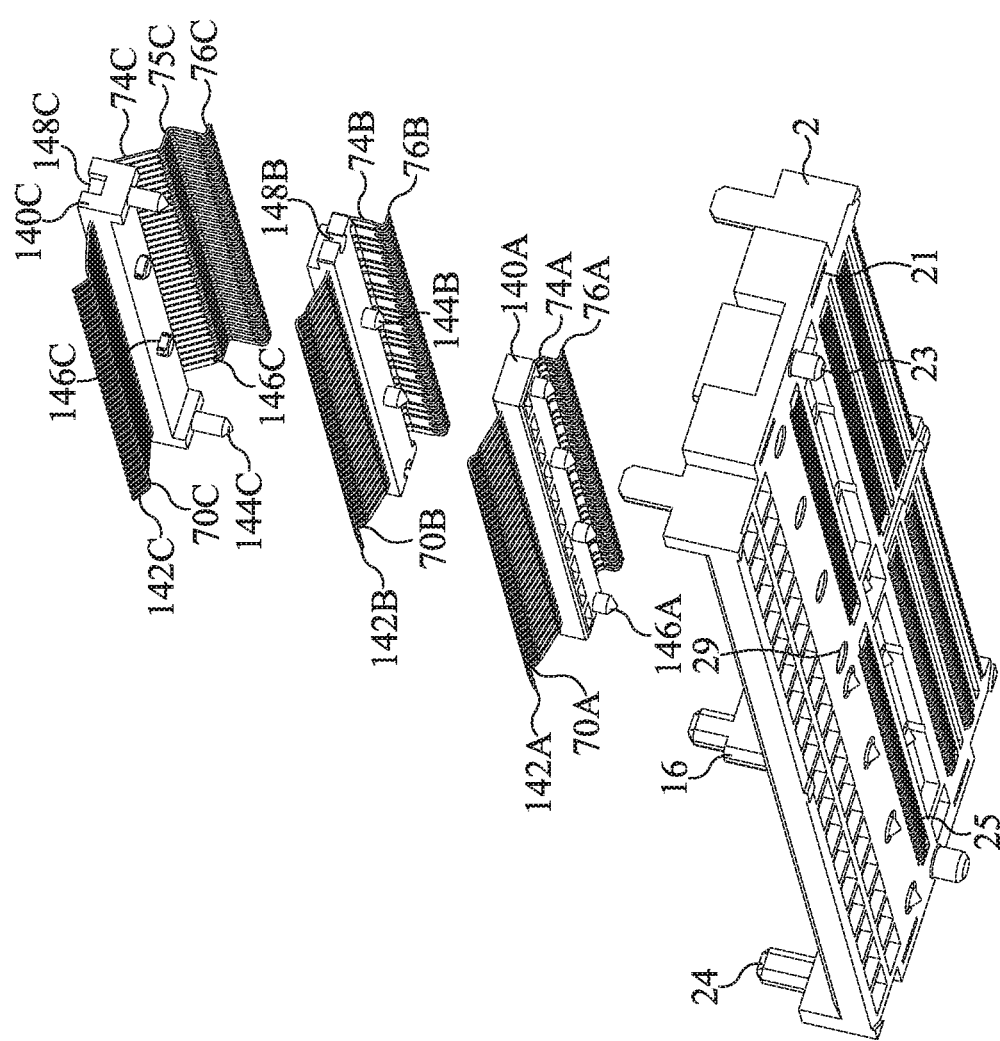
FIG. 13 is a schematic diagram, from a different perspective, illustrating the arrangement shown in FIG. 12, in accordance with some embodiments of the present disclosure.

FIG. 12 is a schematic diagram illustrating an arrangement of the lower housing 2, the first terminal group 14A, the second terminal group 14B and the third terminal group 14C, in accordance with some embodiments of the present disclosure. FIG. 13 is a schematic diagram, from a different perspective, illustrating the arrangement shown in FIG. 12, in accordance with some embodiments of the present disclosure. Referring to FIGS. 12 and 13, the lower housing 2 includes a raised portion 27 and a receiving portion 28. The receiving portion 28 functions to receive the first terminal group 14A, which will be described in detail below. The raised portion 27 functions to support the second terminal group 14B, the third terminal group 14C and the fourth terminal group 14D, which will be described in detail below.

Figure 14:
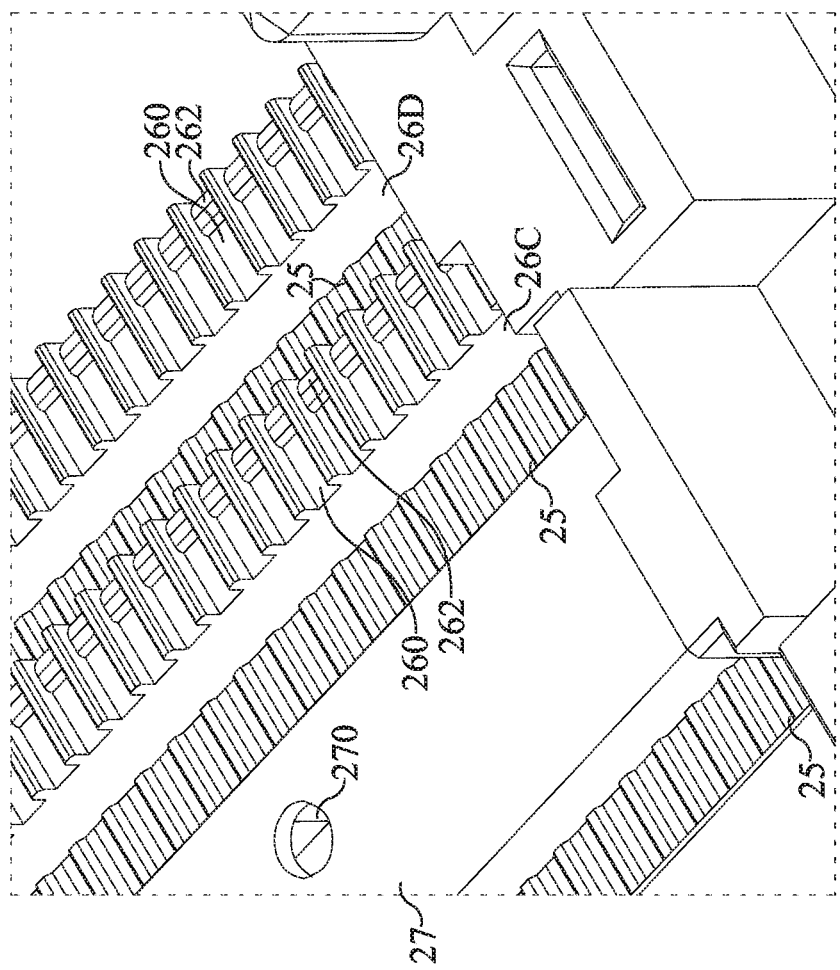
FIG. 14 is a partially enlarged schematic view of FIG. 12, in accordance with some embodiments of the present disclosure.
Figure 15:
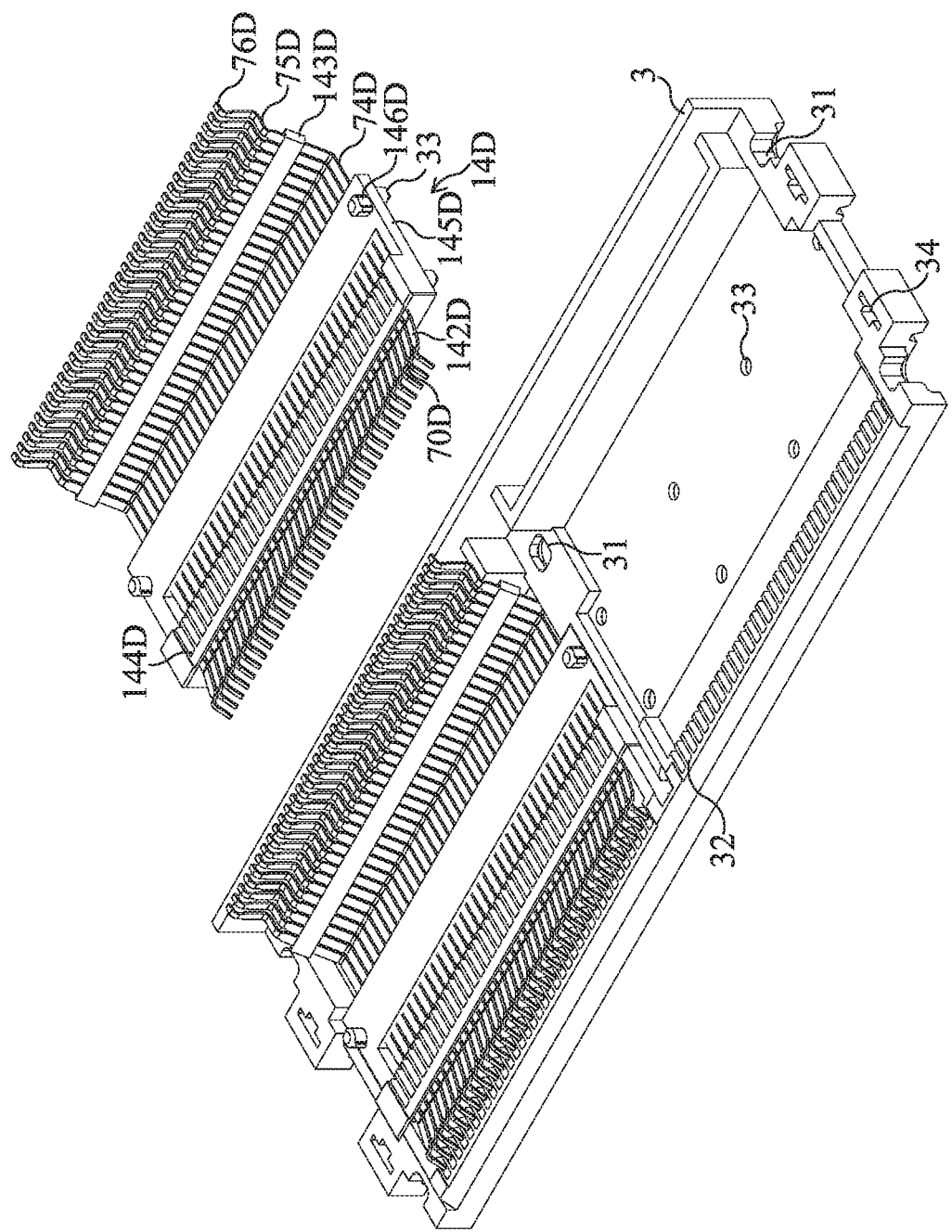
FIG. 15 is a schematic diagram illustrating an arrangement of an upper housing and a fourth terminal group, in accordance with some embodiments of the present disclosure.
Figure 16:
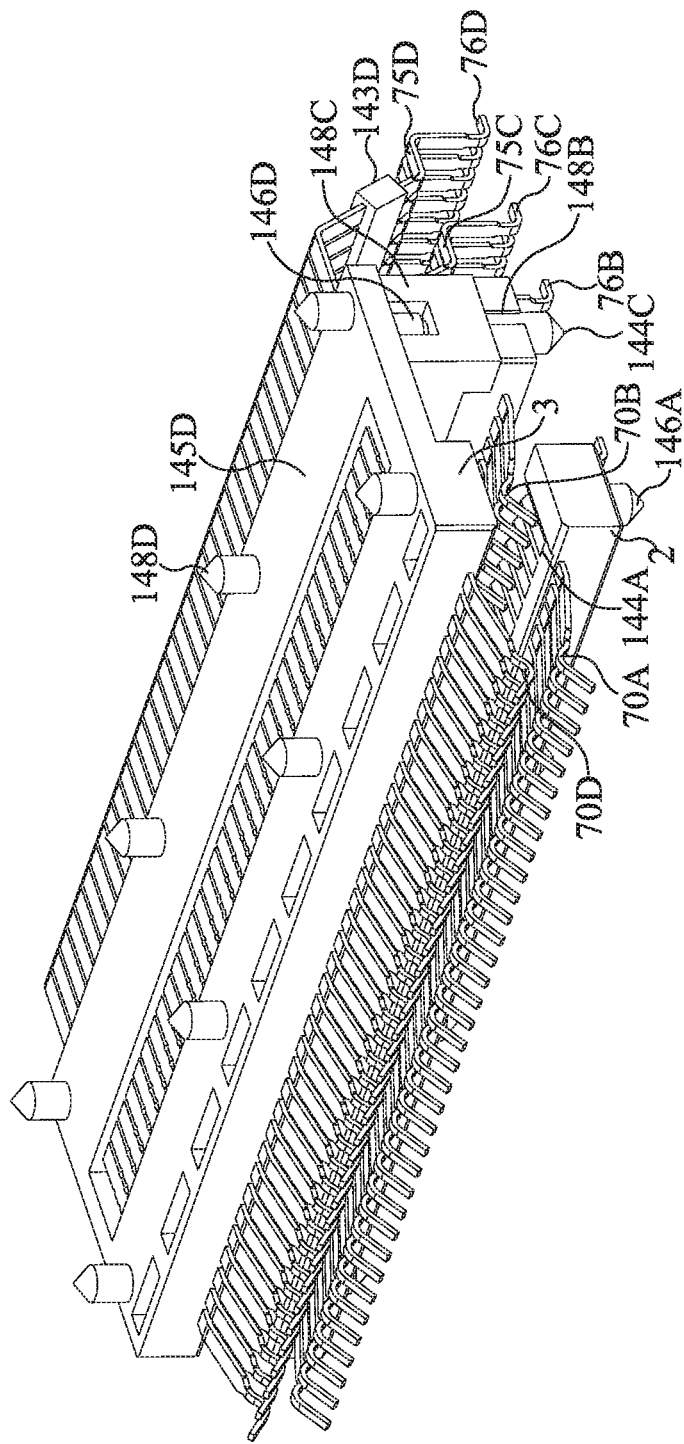
FIG. 16 is a schematic diagram illustrating an arrangement of the first terminal group, the second terminal group, the third terminal group and the fourth terminal group in the absence of the insulating housing shown in FIG. 8, in accordance with some embodiments of the present disclosure.
Figure 17:
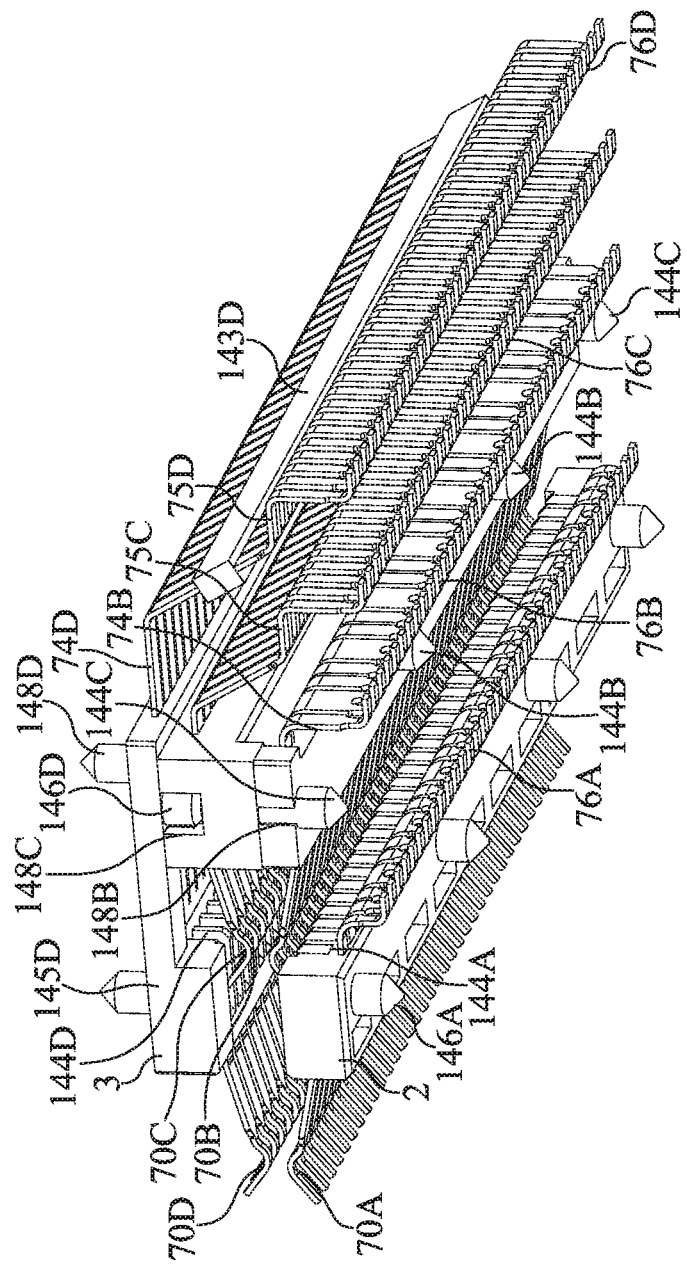
FIG. 17 is a schematic diagram, from different perspectives, illustrating the arrangement shown in FIG. 16, in accordance with some embodiments of the present disclosure.
Figure 18A:
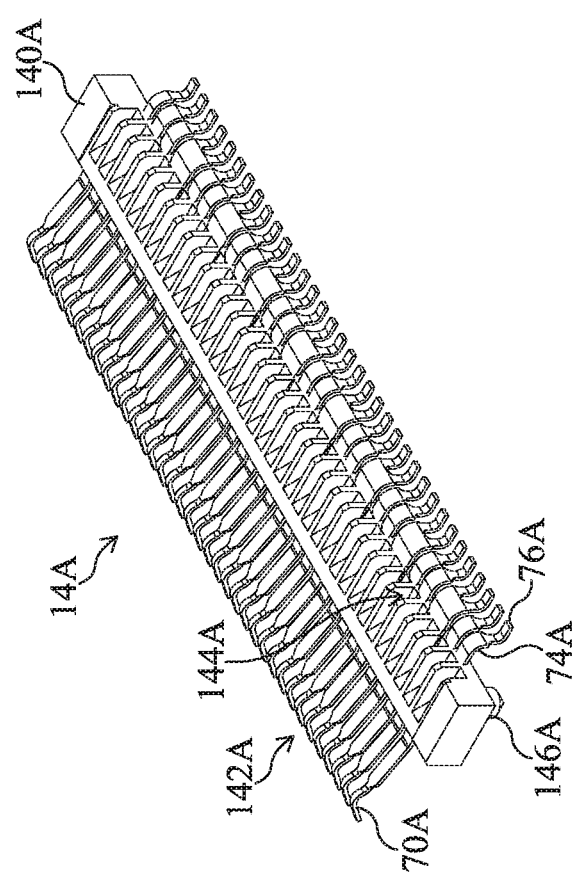
FIG. 18A is an assembled diagram of the first terminal group shown in FIG. 12, in accordance with some embodiments of the present disclosure.
Figure 18B:
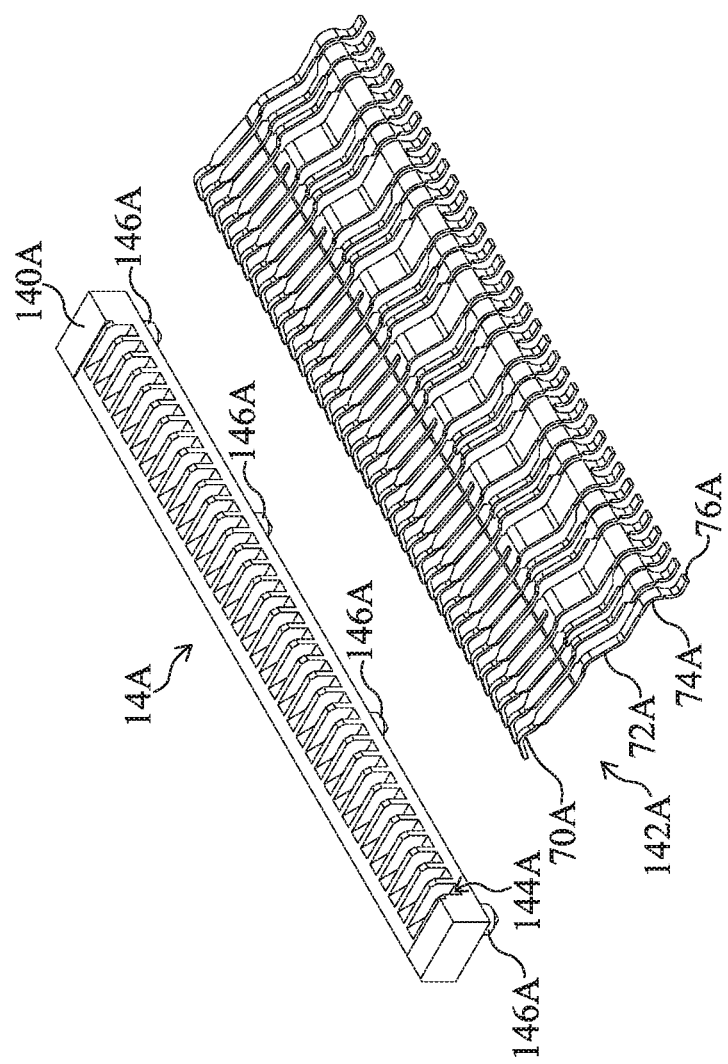
FIG. 18B is a disassembled diagram of the first terminal group shown in FIG. 12, in accordance with some embodiments of the present disclosure.
Figure 19A:
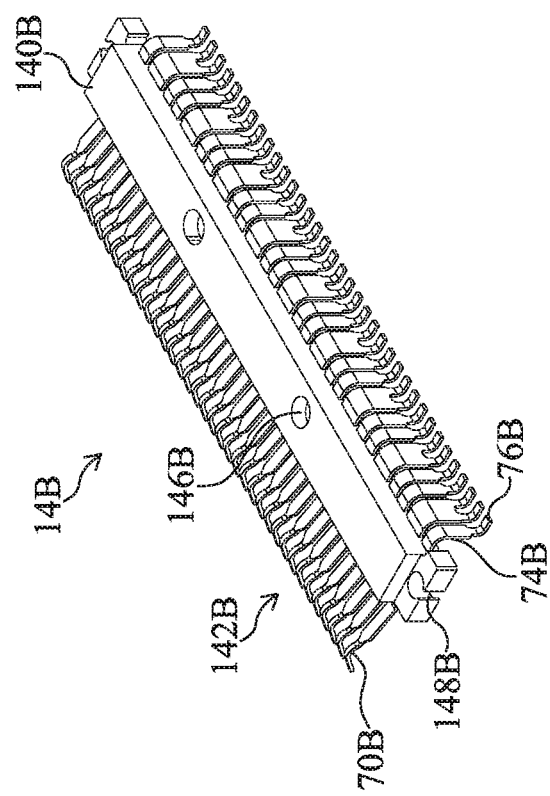
FIG. 19A is an assembled diagram of the second terminal group shown in FIG. 12, in accordance with some embodiments of the present disclosure.
Figure 19B:
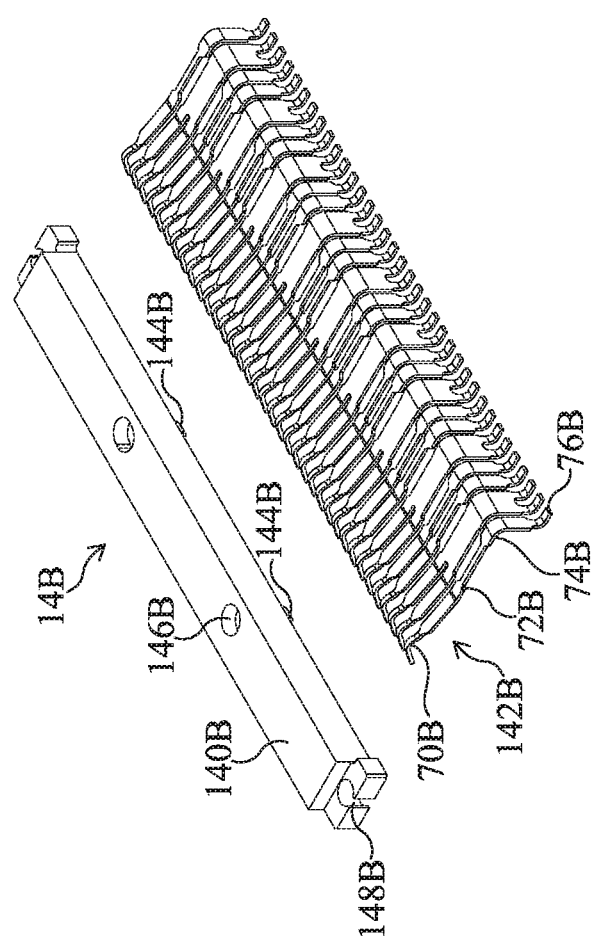
FIG. 19B is a disassembled diagram of the second terminal group shown in FIG. 12, in accordance with some embodiments of the present disclosure.
Figure 20A:
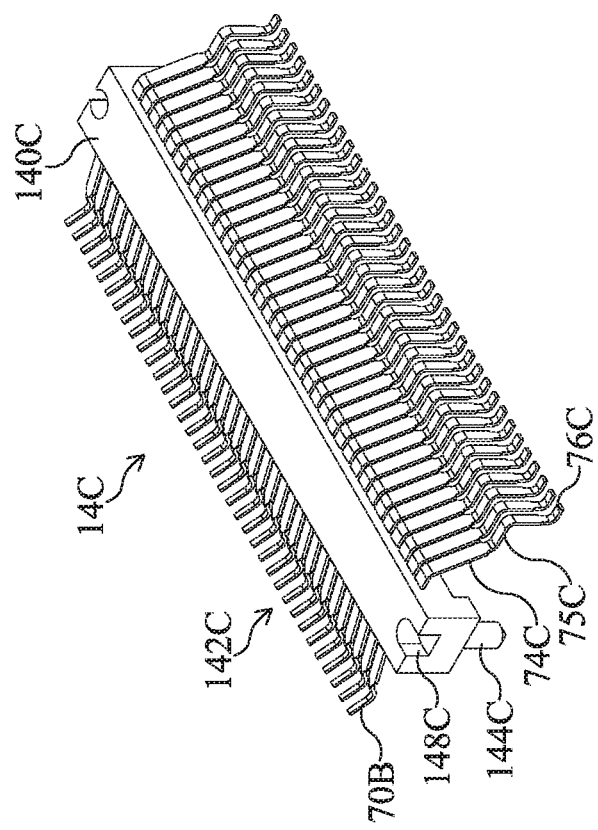
FIG. 20A is an assembled diagram of the third terminal group shown in FIG. 12, in accordance with some embodiments of the present disclosure.
Figure 20B:
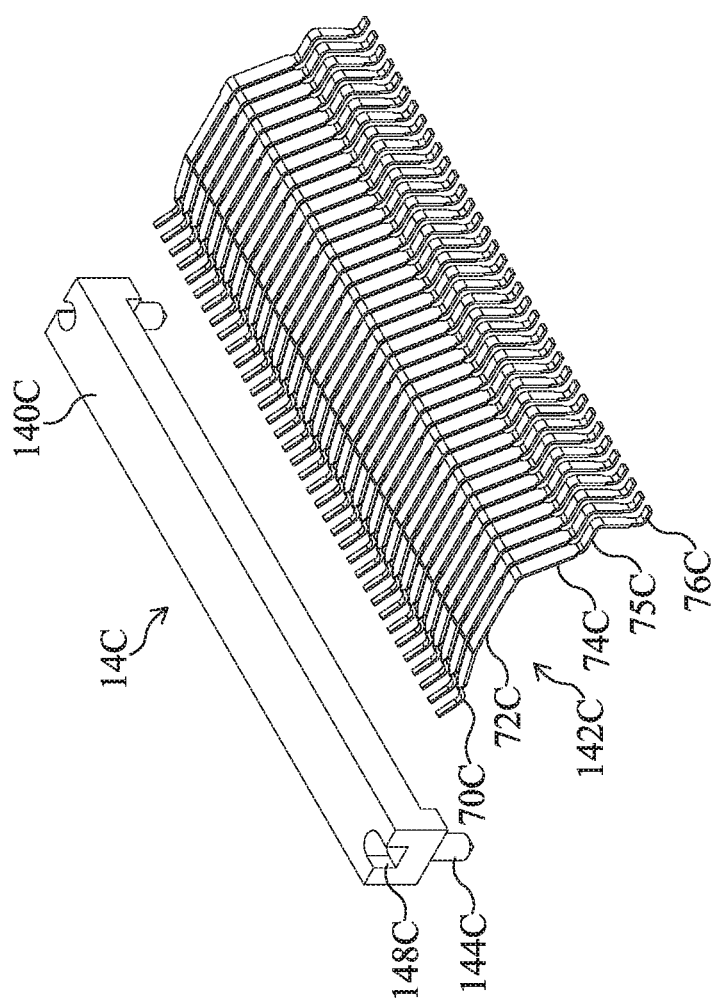
FIG. 20B is a disassembled diagram of the third terminal group shown in FIG. 12, in accordance with some embodiments of the present disclosure.
Figure 21A:
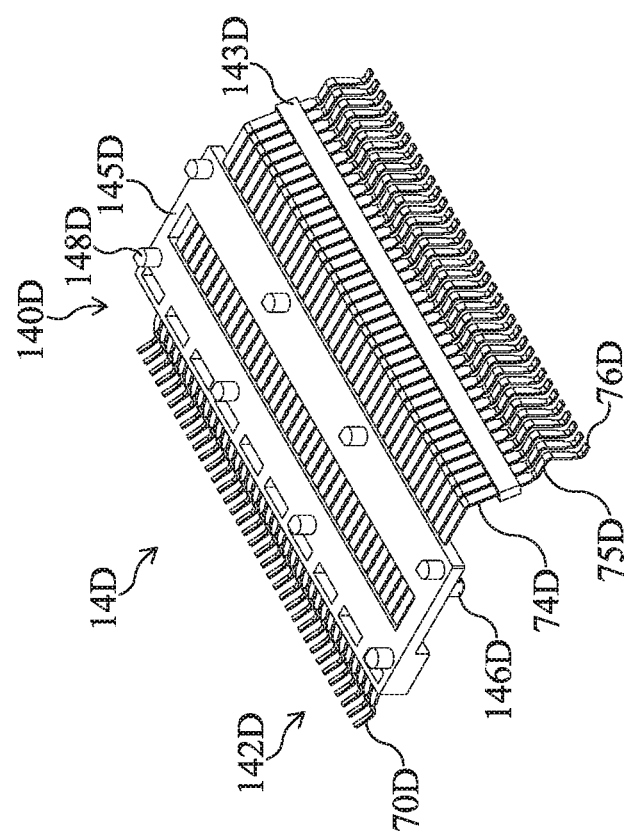
FIG. 21A is an assembled diagram of the fourth terminal group shown in FIG. 15, in accordance with some embodiments of the present disclosure.
Figure 21B:
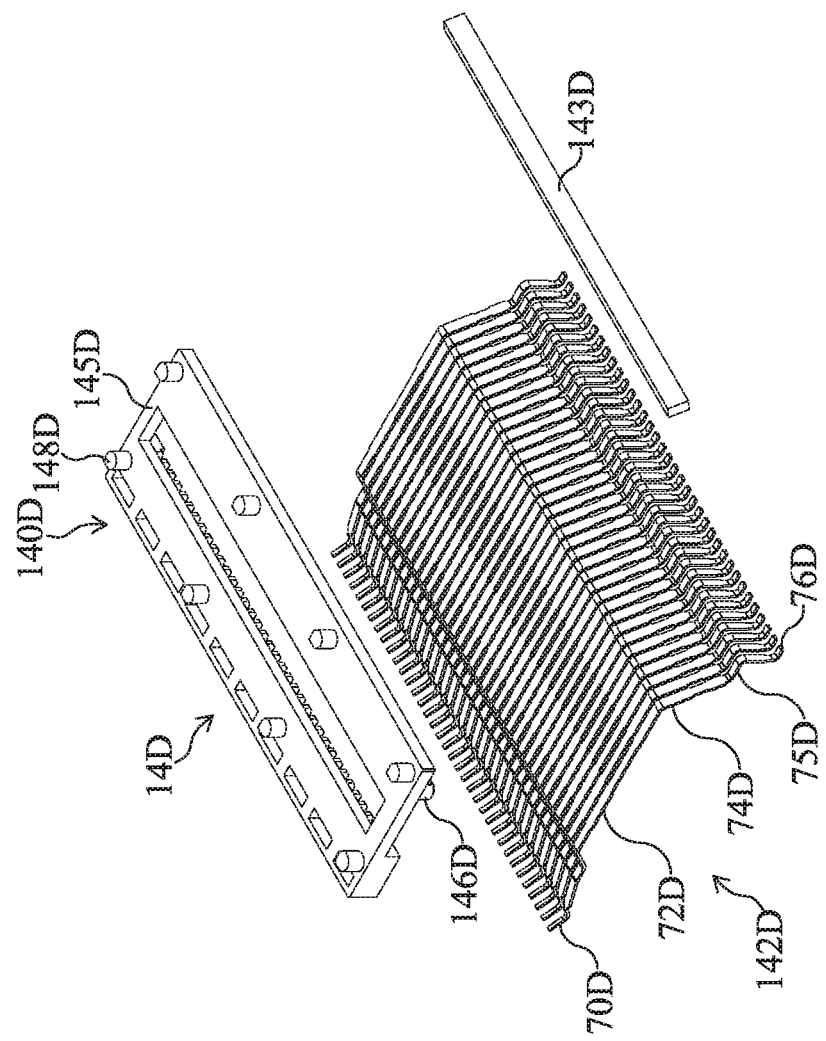
FIG. 21B is a disassembled diagram of the fourth terminal group shown in FIG. 15, in accordance with some embodiments of the present disclosure.
Figure 22:
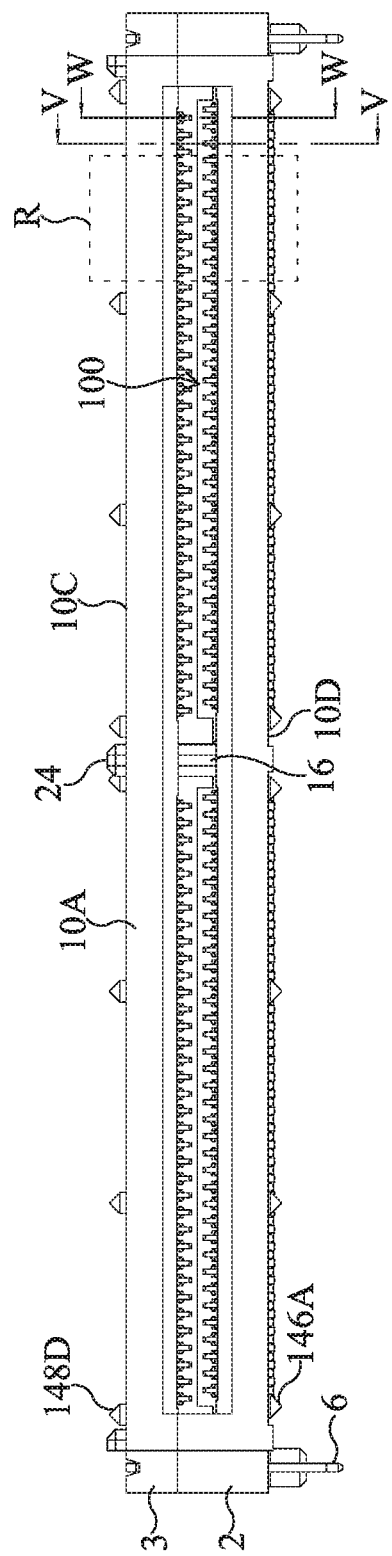
FIG. 22 is a front perspective view of the board edge connector shown in FIG. 1, in accordance with some embodiments of the present disclosure.
Figure 23:
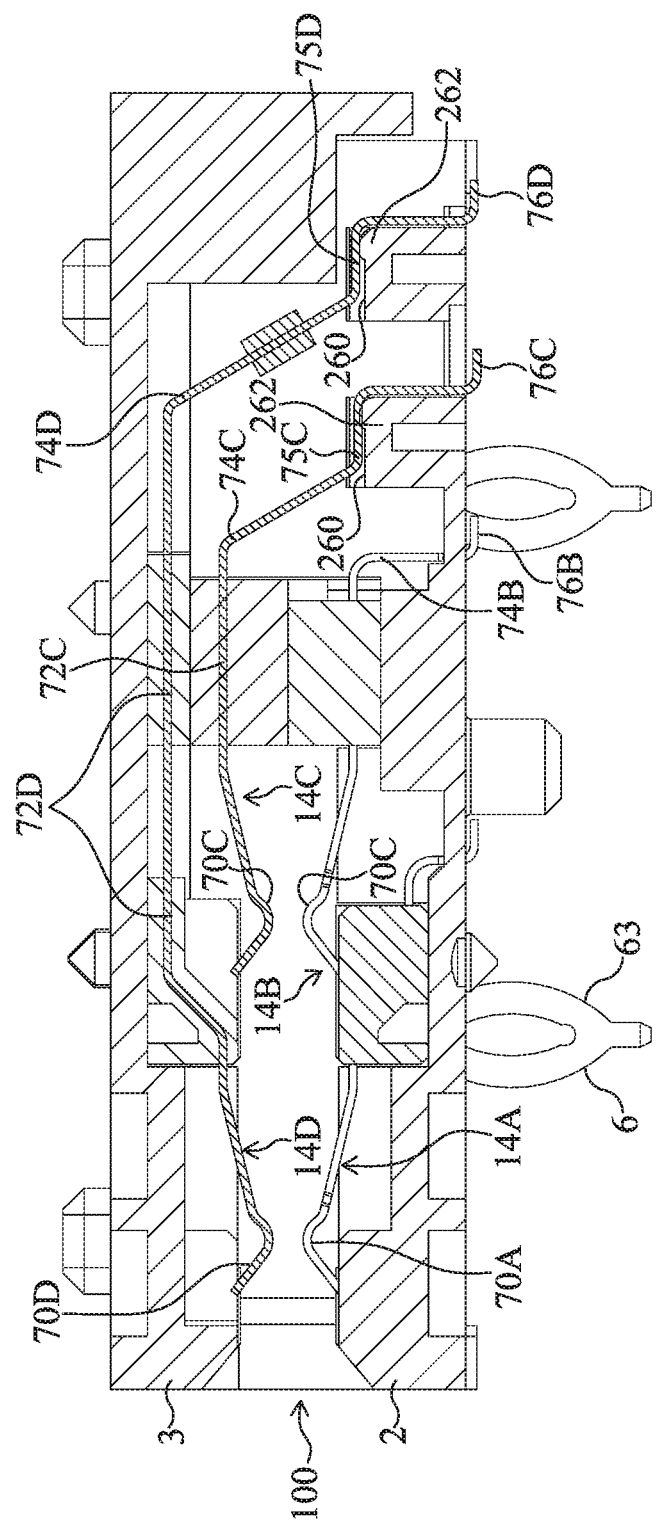
FIG. 23 is a cross-sectional diagram of the board edge connector shown in FIG. 22 along a line W-W, in accordance with some embodiments of the present disclosure.
Figure 24:
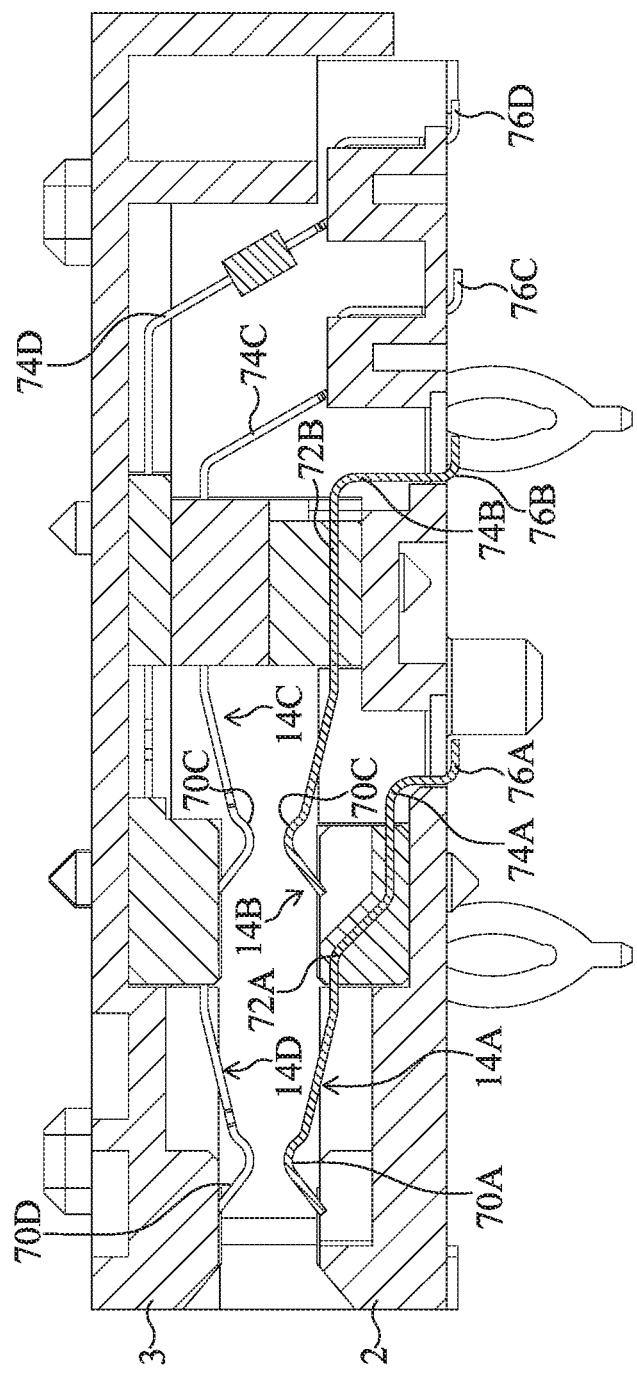
FIG. 24 is a cross-sectional diagram of the board edge connector shown in FIG. 22 along a line V-V, in accordance with some embodiments of the present disclosure.

FIG. 14 is a partially enlarged schematic view of FIG. 12, in accordance with some embodiments of the present disclosure. FIG. 15 is a schematic diagram illustrating an arrangement of the upper housing 3 and the fourth terminal group 14D, in accordance with some embodiments of the present disclosure. FIG. 16 is a schematic diagram illustrating an arrangement of the first terminal group 14A, the second terminal group 14B, the third terminal group 14C and the fourth terminal group 14D in the absence of the insulating housing 12 shown in FIG. 8, in accordance with some embodiments of the present disclosure. FIG. 17 is a schematic diagram, from different perspectives, illustrating the arrangement shown in FIG. 16, in accordance with some embodiments of the present disclosure. FIG. 18A is an assembled diagram of the first terminal group 14A shown in FIG. 12, in accordance with some embodiments of the present disclosure. FIG. 18B is a disassembled diagram of the first terminal group 14A shown in FIG. 12, in accordance with some embodiments of the present disclosure. FIG. 19A is an assembled diagram of the second terminal group 14B shown in FIG. 12, in accordance with some embodiments of the present disclosure. FIG. 19B is a disassembled diagram of the second terminal group 14B shown in FIG. 12, in accordance with some embodiments of the present disclosure. FIG. 20A is an assembled diagram of the third terminal group 14C shown in FIG. 12, in accordance with some embodiments of the present disclosure. FIG. 20B is a disassembled diagram of the third terminal group 14C shown in FIG. 12, in accordance with some embodiments of the present disclosure. FIG. 21A is an assembled diagram of the fourth terminal group 14D shown in FIG. 15, in accordance with some embodiments of the present disclosure. FIG. 21B is a disassembled diagram of the fourth terminal group 14D shown in FIG. 15, in accordance with some embodiments of the present disclosure. FIG. 22 is a front perspective view of the board edge connector 1 shown in FIG. 1, in accordance with some embodiments of the present disclosure. FIG. 23 is a cross-sectional diagram of the board edge connector 1 shown in FIG. 22 along a line W-W, in accordance with some embodiments of the present disclosure. FIG. 24 is a cross-sectional diagram of the board edge connector 1 shown in FIG. 22 along a line V-V, in accordance with some embodiments of the present disclosure.

Referring to FIGS. 14 to 24, the first terminal group 14A is in front of the second terminal group 14B in the front and back direction. The third terminal group 14C superposes the second terminal group 14B. The fourth terminal group 14D superposes the third terminal group 14C.

The first terminal group 14A includes a first insulating member 140A and a plurality of first terminals 142A. The first terminals 142A are arranged in a row extending in a left to right direction. Each of the first terminals 142A includes a resilient contact portion 70A, a holding portion 72A, a connecting portion 74A and an SMT tail portion 76A. The resilient contact portion 70A extends from the holding portion 72A and into the board edge receiving slot 100. Moreover, the resilient contact portion 70A extends into a recess 22 of the lower housing 2 when pressed. The SMT tail portion 76A extends from the holding portion 72A to and out of the mounting end 10D. In further detail, the SMT tail portion 76A extends to the mounting end 10D from a window 25 of the lower housing 2. The connecting portion 74A is between the holding portion 72A and the SMT tail portion 76A. Additionally, the holding portion 72A is insert molded in the first insulating member 140A.

Moreover, the first terminal group 14A serves as a high frequency terminal group configured to transmit a high frequency signal.

The holding portion 72A of each of the ground terminals 80 is wider than that of the signal terminals 82. Moreover, two resilient contact portions 70A and two SMT tail portions 76A extend from the holding portion 72A of the ground terminal 80. In addition, the resilient contact portions 70A and the SMT tail portions 76A of the high frequency terminal group are arranged in a pattern of GGSSGGSSGG . . . , where a portion which transmits a reference ground is indicated by G, and a portion which transmits the high frequency signal is indicated by S. The holding portions 72A of the high frequency terminal group are arranged in a pattern of GSSGSSG . . . . With this pattern, a crosstalk effect can be decreased, thereby increasing transmission speed of the terminals and increasing signal integrity (SI) performance.

The first insulating member 140A includes a plurality of recesses 144A and a plurality of heat stake posts 146A. Referring back to FIG. 12, each of the heat stake posts 146A is inserted into a post hole 29 of the receiving portion 28. In the present disclosure, the receiving portion 28 includes four post holes 29. However, the present disclosure is not limited thereto.

The second terminal group 14B includes a second insulating member 140B and a plurality of second terminals 142B. The second terminals 142B are arranged in a row extending in the left to right direction. Each of the second terminals 142B includes a resilient contact portion 70B, a holding portion 72B, a connecting portion 74B and an SMT tail portion 76B. A structural relationship among the resilient contact portion 70B, the holding portion 72B, the connecting portion 74B and the SMT tail portion 76B is similar to that among the resilient contact portion 70A, the holding portion 72A, the connecting portion 74A and the SMT tail portion 76A. Therefore, the detailed descriptions are omitted herein.

The resilient contact portion 70B extends from the holding portion 72B and into the board edge receiving slot 100. Moreover, as shown in FIG. 16, the resilient contact portion 70B extends into the recess 144A of the first insulating member 140A when pressed. The SMT tail portion 76B extends to the mounting end 10D from the window 25 of the lower housing 2. Additionally, the holding portion 72B is insert molded in the second insulating member 140B.

Moreover, the second terminal group 14B also serves as a high frequency terminal group.

The second insulating member 140B includes a plurality of heat stake posts 144B, a plurality of positioning recesses 146B and a plurality of holes 148B. Referring back to FIG. 12, each of the heat stake posts 144B is inserted into a post hole 270 of the raised portion 27. In the present disclosure, the second insulating member 140B includes two heat stake posts 144B, and the raised portion 27 includes two post holes 270. However, the present disclosure is not limited thereto.

In the present embodiment, two terminal groups 14A and 14B serve as the high frequency terminal group. However, the present disclosure is not limited thereto. In some embodiment, at least one of terminal groups of the board edge connector 1 serves as a high frequency terminal group.

The third terminal group 14C includes a third insulating member 140C and a plurality of third terminals 142C. The third terminals 142C are arranged in a row extending in the left to right direction. Each of the third terminals 142C includes a resilient contact portion 70C, a holding portion 72C, a connecting portion 74C and an SMT tail portion 76C. A structural relationship among the resilient contact portion 70C, the holding portion 72C, the connecting portion 74C and the SMT tail portion 76C is similar to that among the resilient contact portion 70A, the holding portion 72A, the connecting portion 74A and the SMT tail portion 76A except that the connecting portion 74C is longer in the front and back direction than the connecting portions 74A and 74B. Additionally, the holding portion 72C is insert molded in the third insulating member 140C.

The longer connecting portion 74C includes a supported portion 75C. Referring to FIG. 14, the lower housing 2 includes a supporting portion 26C. The supporting portion 26C includes a plurality of supporting grooves 260 disposed thereon. The supported portion 75C of the third terminal 142C is disposed on and supported by the supporting grooves 260. In further detail, each of the supporting grooves 260 includes a projection rib 262 at a rear end of the supporting groove 260. The projection rib 262 functions to support the supported portion 75C of the third terminal 142C. With the supported portion 75C and the projection rib 262, the third terminal 142C is able to sit on the lower housing 2 for better coplanarity control of the SMT tail portion 76C. The resilient contact portion 70C extends from the holding portion 72C and into the board edge receiving slot 100.

Moreover, the third terminal group 14C serves as a low frequency terminal group configured to transmit a non-high frequency signal. As such, the third terminal group 14C has the different patterns from the first and second terminal groups 14A and 14B.

The third insulating member 140C includes a plurality of heat stake posts 144C, a plurality of positioning blocks 146C and a plurality of positioning holes 148C. Referring back to FIG. 12, each of the heat stake posts 144C is inserted into a post hole 272 of the raised portion 27 through the hole 148B of the second insulating member 140B. The third insulating member 140C is aligned to the second insulating member 140B by aligning the positioning block 146C to the positioning recess 146B of the second insulating member 140B.

The fourth terminal group 14D includes a fourth insulating member 140D and a plurality of fourth terminals 142D. The fourth terminals 142D are arranged in a row extending in the left to right direction. Each of the fourth terminals 142D includes a resilient contact portion 70D, a holding portion 72D, a connecting portion 74D and an SMT tail portion 76D. A structural relationship among the resilient contact portion 70D, the holding portion 72D, the connecting portion 74D and the SMT tail portion 76D is similar to that among the resilient contact portion 70C, the holding portion 72C, the connecting portion 74C and the SMT tail portion 76C. The fourth terminal 142D also has a longer connecting portion 74D. Additionally, the holding portion 72D is insert molded in the fourth insulating member 140D.

The longer connecting portion 74D includes a supported portion 75D. Referring to FIG. 14, the lower housing 2 includes a supporting portion 26D. The supporting portion 26D includes a plurality of supporting grooves 260. The supported portion 75D is disposed on and supported by the supporting grooves 260. In further detail, each of the supporting grooves 260 includes a projection rib 262. The projection rib 262 functions to support the supported portion 75D. With the supported portion 75D and the projection rib 262, the fourth terminal 142D is able to sit on the lower housing 2 for better coplanarity control of the SMT tail portion 76D. The resilient contact portion 70D extends from the holding portion 72D and into the board edge receiving slot 100. Moreover, the resilient contact portion 70D extends into a recess 32 of the higher housing 3 when pressed.

The fourth terminal group 14D also serves as a low frequency terminal group configured to transmit a non-high frequency signal. In the present embodiment, two terminal groups 14C and 14D serve as the low frequency terminal group. However, the present disclosure is not limited thereto. In some embodiment, at least one of terminal groups of the board edge connector 1 serves as a low frequency terminal group.

The fourth insulating member 140D includes an insulating strip 143D and an insulating body 145D. The insulating body 145D includes a plurality of recesses 144D, a plurality of positioning blocks 146D and a plurality of heat stake posts 148D. Referring to FIG. 17, the resilient contact portion 70C extends into the recess 144D of the fourth insulating member 140D when pressed. The fourth insulating member 140D is aligned to the third insulating member 140C by aligning the positioning block 146D to the positioning hole 148C. Each of the heat stake posts 148D is inserted into an opening 33 of the upper housing 3.

The resilient contact portions 70A and 70D are at the front of the board edge receiving slot 100, and face opposed to each other in an up and down direction. The resilient contact portions 70B and 70C are at a back of the board edge receiving slot, and face opposed to each other in the up and down direction. The SMT tail portions 76A, 76B, 76C and 76D are arranged in order from the front to the back of the mounting end 10D. Additionally, the SMT tail portions 76A, 76B, 76C and 76D are welded on solder pads 52 of the PCB 5.

The first terminal group 14A is in front of the second terminal group 14B serving as a high frequency terminal group. Moreover, the first terminal group 14A and the second terminal group 14B are located at the bottom of the insulating housing 12 and close to the mounting end 10D. As such, a length of each of the first terminal 142A and the second terminal 142B is relatively short. A transmission distance is accordingly short. As a result, an undesired crosstalk effect can be further decreased.

Figure 25:
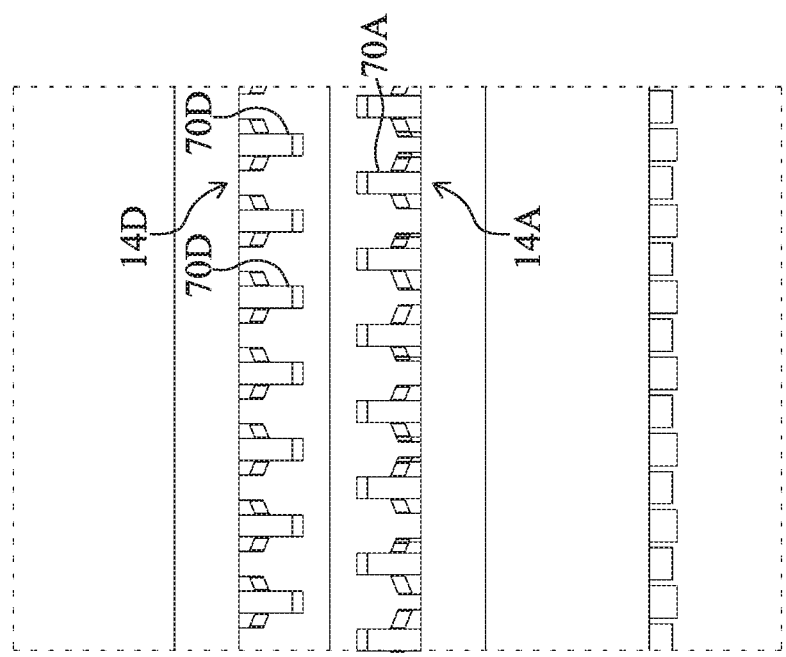
FIG. 25 is an enlarged diagram of a region R shown in FIG. 22, in accordance with some embodiments of the present disclosure.

FIG. 25 is an enlarged diagram of a region R shown in FIG. 22, in accordance with some embodiments of the present disclosure. Referring to FIG. 25, the resilient contact portion 70D is arranged offset, in a left and right direction, from the resilient contact portion 70A. In further detail, the resilient contact portion 70D is between the resilient contact portions 70A.

Similarly, the resilient contact portion 70B is arranged offset, in a left and right direction, from the resilient contact portion 70C. In further detail, the resilient contact portion 70B is between the resilient contact portions 70C.

Figure 26:
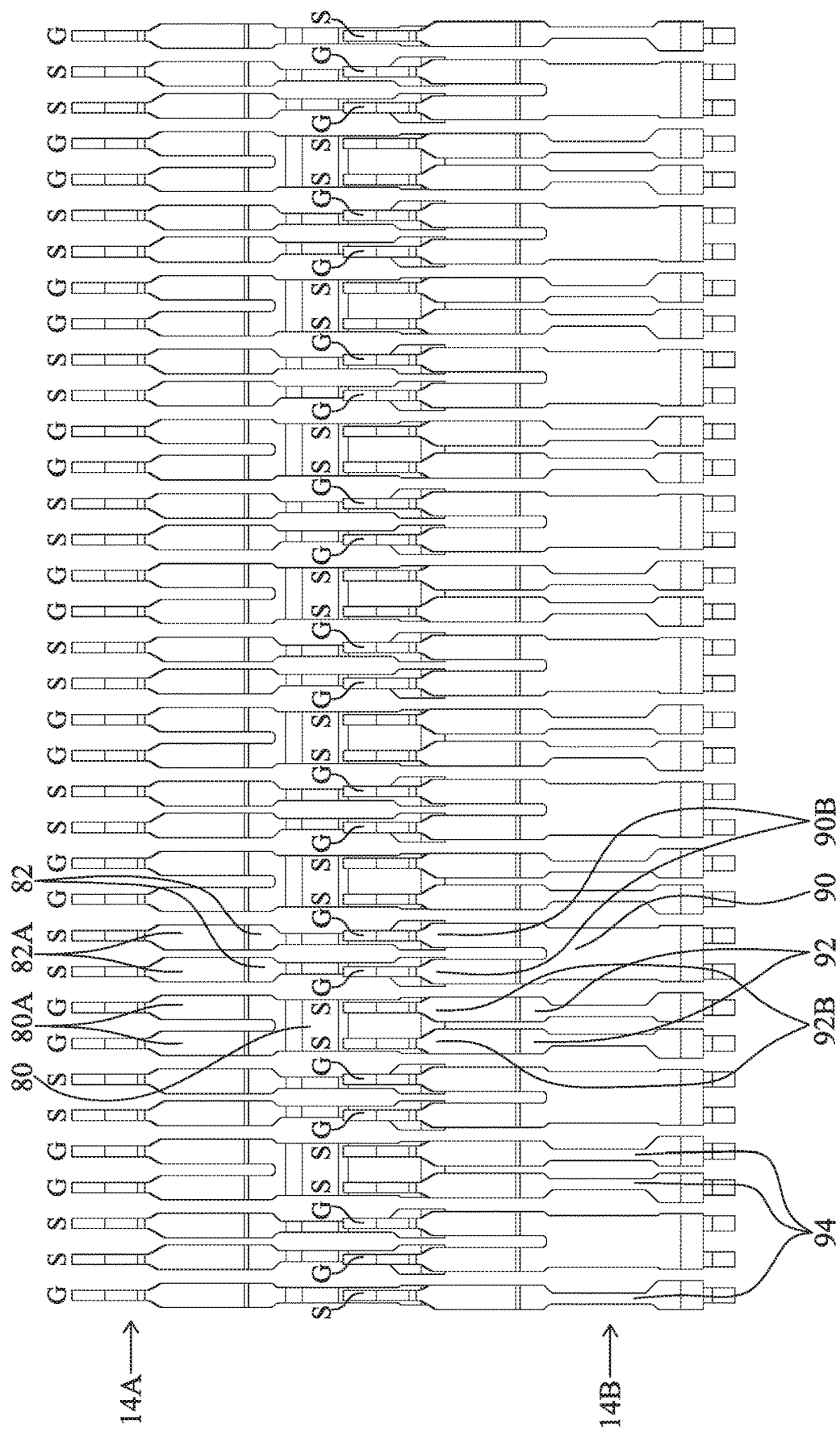
FIG. 26 is a schematic diagram illustrating arrangement of the first terminal group and the second terminal group shown in FIG. 12, in accordance with some embodiments of the present disclosure.

FIG. 26 is a schematic diagram illustrating arrangement of the first terminal group 14A and the second terminal group 14B shown in FIG. 12, in accordance with some embodiments of the present disclosure. Referring to FIG. 26, an arrangement of the first terminal group 14A and the second terminal group 14B which serve as a high-frequency terminal group is depicted.

The first terminal group 14A includes a plurality of differential pairs of signal terminals, and a plurality of ground terminals. For convenience of discussion, the first terminal 142A, which serves as a signal terminal, is labeled 82; and the first terminal 142A, which serves as a ground terminal, is labeled 80.

The differential pairs of signal terminals 82 and the ground terminals 80 are arranged in an alternating manner. The term "alternating manner" means that one side of one differential pairs of signal terminals 82 is disposed with the ground terminal 80, and the other side of the one differential pairs of signal terminals 82 is disposed with other ground terminal 80. Alternatively, the ground terminals 80 are disposed between two differential pairs of signal terminal 82.

In further detail, for convenience of discussion, the resilient contact portion 70A of the first terminal 142A serving as the ground terminal 80 is labeled 80A. The resilient contact portion 70A of the first terminal 142A serving as the signal terminal 82 is labeled 82A.

The resilient contact portion 80A and the resilient contact portion 82A of a high frequency terminal group are arranged in a pattern of GGSSGGSSGG . . . , except the leftmost and the rightmost first terminals 142A of the first terminal group 14A, where a portion which transmits a reference ground is indicated by G, and a portion which transmits the high frequency signal is indicated by S.

The SMT tail portions of the ground terminal 80 and the signal terminal 82 has the same pattern of GGSSGGSSGG as the resilient contact portions 80A and 82A.

The second terminal group 14B includes a plurality of differential pairs of signal terminals, and a plurality of ground terminals. For convenience of discussion, the second terminal 142B, which serves as a signal terminal, is labeled 92; and the second terminal 142B, which serves as a ground terminal, is labeled 90.

The differential pairs of signal terminals 92 and the ground terminals 90 are arranged in the alternating manner as previously mentioned.

In further detail, for convenience of discussion, the resilient contact portion 70B of the second terminal 142B serving as the ground terminal 90 is labeled 90B. The resilient contact portion 70B of the second terminal 142B serving as the signal terminal 92 is labeled 92B.

The resilient contact portion 90B and the resilient contact portion 92B of a high frequency terminal group are also arranged in the pattern of GGSSGGSSGG . . . , except the leftmost and the rightmost second terminals 142B of the second terminal group 14B.

The SMT tail portions of the ground terminal 90 and the signal terminal 92 has the same pattern of GGSSGGSSGG as the resilient contact portions 90B and 92B.

Although the first terminal group 14A and the second terminal group 14B has the same pattern, the pattern of the second terminal group 14B is arranged offset from that of the first terminal group 14A. The resilient contact portion 92B of S corresponds to the resilient contact portion 80A of G; and the resilient contact portion 90B of G corresponds to the resilient contact portion 82A of S.

In an embodiment, the resilient contact portions 80A and 82A of the first terminal group 14A, the resilient contact portions 90B and 92B of the second terminal group 14B, the resilient contact portions 70C of the third terminal group 14C and the resilient contact portions 70D of the fourth terminal group 14D are arranged in a pattern as shown in Table 1. The following table reflects the corresponding relationship of those resilient contact portions.

TABLE 1

| | | | | | | | | | |
|---|---|---|---|---|---|---|---|---|---|
| 14A | G | S | S | G | G | S | S | G | G |
| 14B | S | G | G | S | S | G | G | S | S |
| 14C | G | S | G | S | G | S | G | S | G |
| 14D | P | P | P | P | P | P | P | P | P |

Where P represents a portion of a terminal transmitting a power. A pattern of each of the third terminal group 14C can be adjusted, depending on a design of the electrical board 4. For example, in the present embodiment, the third terminal group 14C is arranged in pattern of GSGSGSGS . . . However, the present disclosure is not limited thereto. In the present embodiment, the third terminal 142 includes a single-ended type terminal.

Additionally, a front section of the second terminal 142B is over a rear section of the first terminal 142A. As a result, a crosstalk effect can be decreased, thereby increasing transmission speed of the terminals and increasing signal integrity (SI) performance.

Furthermore, the signal terminal 92 of the second terminal 142B includes a narrow down portion 94 between the resilient contact portion 70B and the holding portion 72B. The narrow down portion 94 is narrower than the holding portion 72B, and therefore has relatively low impedance. As a result, the second terminal 142B has relatively low impedance. The signal terminal 82 of the first terminal 142A also has the same narrow down portion as the narrow down portion 94. As a result, the first terminal 142A has relatively low impedance.

Figure 27:
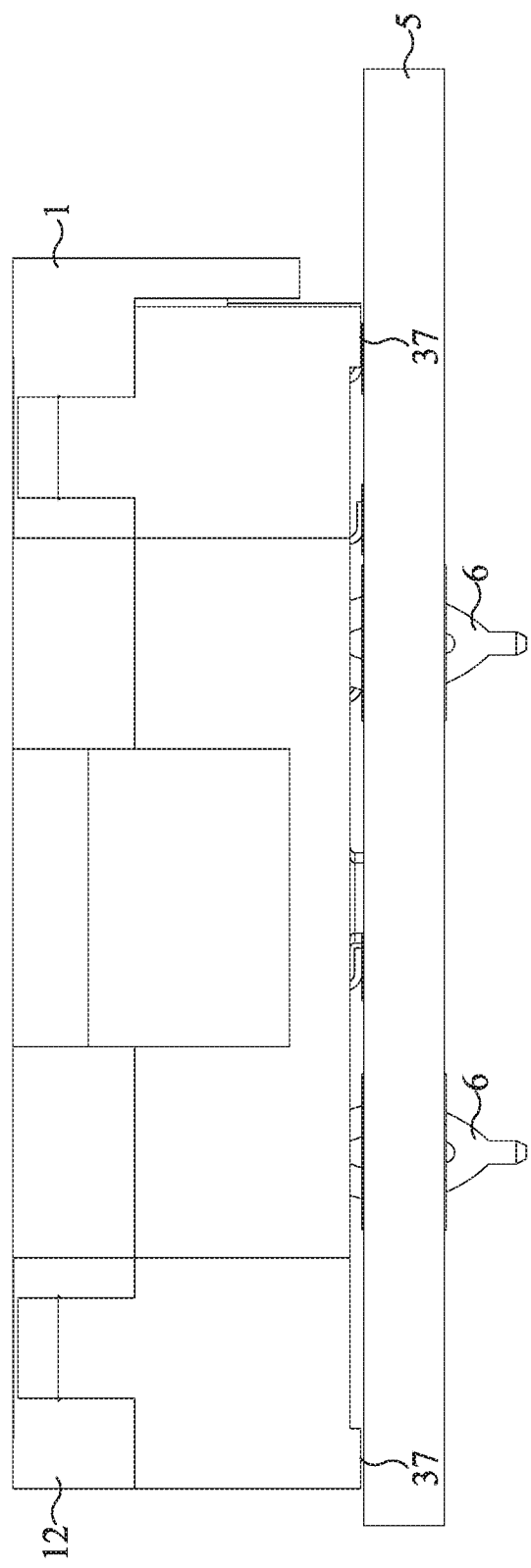
FIG. 27 is a side view of the board edge connector shown in FIG. 1 mounting on the PCB shown in FIG. 1, in accordance with some embodiments of the present disclosure.
Figure 28:
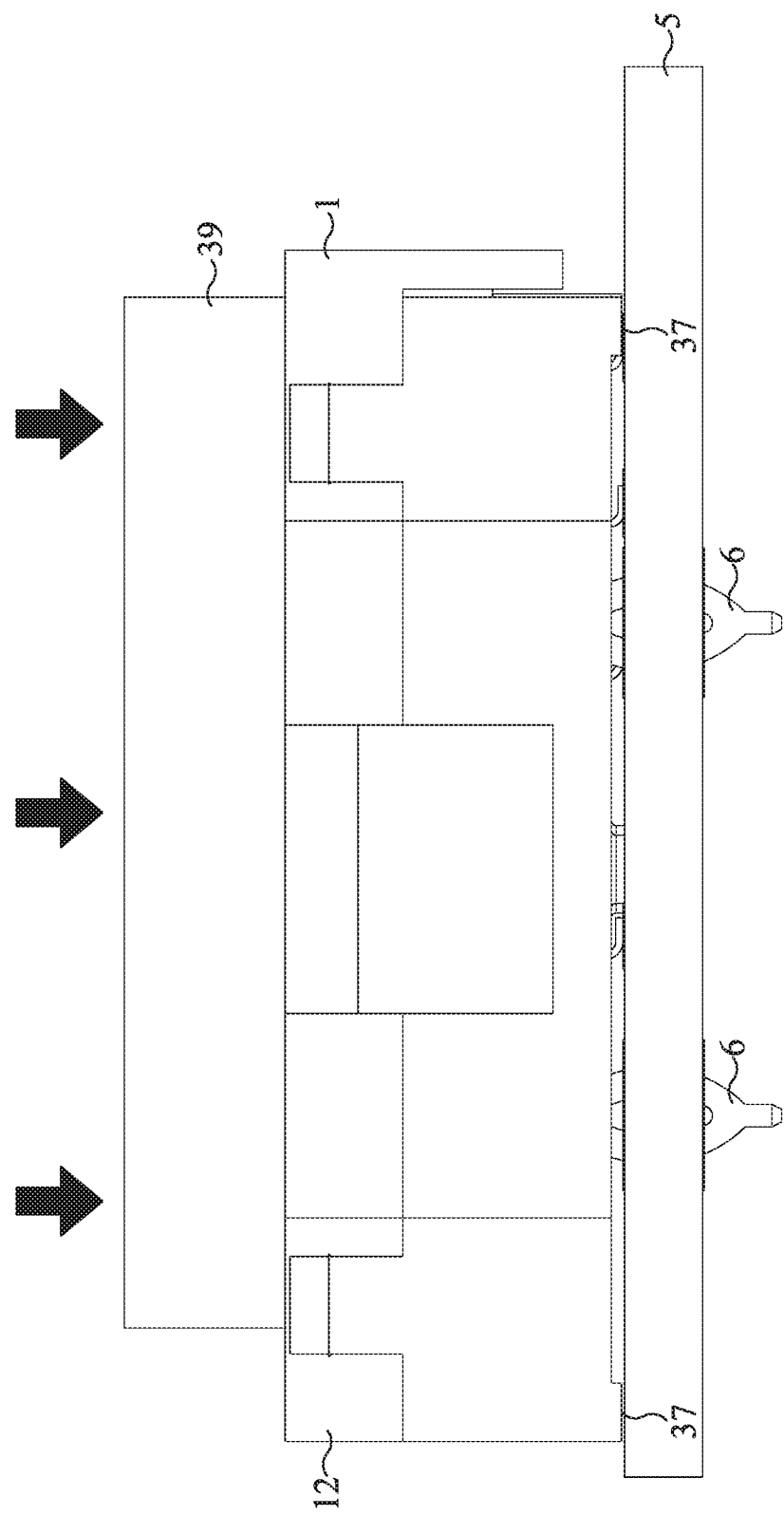
FIG. 28 is a side view of the board edge connector shown in FIG. 1 mounting on the PCB shown in FIG. 1 by using a hold down fixture, in accordance with some embodiments of the present disclosure.

FIG. 27 is a side view of the board edge connector 1 shown in FIG. 1 mounting on the PCB 5 shown in FIG. 1, in accordance with some embodiments of the present disclosure. FIG. 28 is a side view of the board edge connector 1 shown in FIG. 1 mounting on the PCB shown 5 in FIG. 1 by using a hold down fixture 39, in accordance with some embodiments of the present disclosure. Referring to FIGS. 27 and 28, the board edge connector 1 includes four standoffs 29. The four standoffs 29 are disposed on the PCB 5. In some embodiments, by using the hold down fixture 39, during reflow, it can be ensured that the SMT tails portions of the board edge connector 1 are slightly pressed to the solder pads 52 of the PCB 5 for reliable soldering. Such approaches ensure adequate coplanarity before and during reflow due to the high circuit size and complexity of design.

One aspect of the present disclosure provides a board edge connector. The board edge connector includes an insulating housing and a plurality of terminal groups. The insulating housing includes a front surface, a bottom surface, a board edge receiving slot and a supporting portion. The front surface serves as a mating end located at a front of the insulating housing. The bottom surface serves as a mounting end. The board edge receiving slot has an opening toward the mating end. The plurality of terminal groups is retained in the insulating housing. Each of the terminal groups includes a plurality of terminals. The terminals of the each of the terminal groups are arranged in a row extending in a left to right direction. Each terminal includes a holding portion, a resilient contact portion, a tail portion and a connecting portion. The resilient contact portion extends from the holding portion and into the board edge receiving slot. The tail portion extends from the holding portion to and out of the mounting end. The connecting portion is between the holding portion and the tail portion. The terminal of at least one of the terminal groups has a longer connecting portion than the rest of the terminal groups. The longer connecting portion includes a supported portion extending in a front and back direction. The supporting portion includes a plurality of supporting grooves disposed thereon, and the supported portion of the terminal is disposed on and supported by the supporting grooves.

Another aspect of the present disclosure provides a board edge connector. The board edge connector includes an insulating housing and a plurality of terminal groups. The insulating housing includes a front surface, a bottom surface, a board edge receiving slot and a supporting portion. The front surface serves as a mating end located at a front of the insulating housing. The bottom surface serves as a mounting end. The board edge receiving slot has an opening toward the mating end. Each of the terminal groups includes a plurality of terminals. The terminals of the each of the terminal groups are arranged in a row extending in a left to right direction. Each terminal includes a holding portion, a resilient contact portion, a tail portion and a connecting portion. The resilient contact portion extends from the holding portion and into the board edge receiving slot. The tail portion extends from the holding portion to and out of the mounting end. The connecting portion is between the holding portion and the tail portion. At least one of the terminal groups serves as a high frequency terminal group configured to transmit a high frequency signal, and at least one of the terminal groups serves as a low frequency terminal group configured to transmit a non-high frequency signal. The high frequency terminal group includes a plurality of differential pairs of signal terminals, and a plurality of ground terminals. the differential pairs and the ground terminals are arranged in an alternating manner. The resilient contact portions and the tail portions of the high frequency terminal group are arranged in a pattern of GGSSGG, where a portion which transmits a reference ground is indicated by G, and a portion which transmits the high frequency signal is indicated by S.

Another aspect of the present disclosure provides a board edge connector. The board edge connector includes an insulating housing, a first terminal group, a second terminal group, a third terminal group, a fourth terminal group and a first supporting portion. The insulating housing includes a front surface, a back surface, a top surface and a bottom surface. The front surface serves as a mating end of the board edge connector. The back surface faces opposite to the front surface. The bottom surface, opposite to the top surface, serves as a mounting end of the board edge connector. The board edge receiving slot has an opening toward the mating end. The first supporting portion includes a plurality of first supporting grooves. The first terminal group, retained in the insulating housing, includes a plurality of first terminals arranged in a row extending in a left to right direction. Each of the first terminals includes a first resilient contact portion and a first surface mounting technology (SMT) tail portion. The first resilient contact portion extends into the board edge receiving slot. The second terminal group, retained in the insulating housing, includes a plurality of second terminals arranged in a row extending in the left to right direction. Each of the second terminals includes a second resilient contact portion and a second SMT tail portion. The second resilient contact portion extends into the board edge receiving slot. The third terminal group, retained in the insulating housing, includes a plurality of third terminals arranged in a row extending in the left to right direction. Each of the third terminals includes a third holding portion, a third resilient contact portion, a third SMT tail portion and a third connecting portion. The third resilient contact portion extends from the holding portion and into the board edge receiving slot. The third connecting portion is configured to connect the third holding portion to the third SMT tail portion. The fourth terminal group, retained in the insulating housing, includes a plurality of fourth terminals arranged in a row extending in the left to right direction. Each of the fourth terminals includes a fourth holding portion, a fourth resilient contact portion, a fourth SMT tail portion and a fourth connecting portion. The fourth resilient contact portion extends from the fourth holding portion and into the board edge receiving slot. The fourth connecting portion is configured to connect the fourth holding portion to the fourth SMT tail portion. At least one of the third connecting portion and the fourth connecting portion includes a supported portion. The supported portion extends in a front and back direction. The supported portion is on and supported by the first supporting groove. The first resilient contact portion and the fourth resilient contact portion are closer to the front surface than the second resilient contact portion and the third resilient contact portion. The first SMT tail portion, the second SMT tail portion, the third SMT tail portion and the fourth SMT tail portion extend out of the mounting end. The fourth SMT tail portion is closer to the back surface than the first SMT tail portion, the second SMT tail portion and the third SMT tail portion. The third SMT tail portion is closer to the back surface than the first SMT tail portion and the second SMT tail portion, and the second SMT tail portion is closer to the back surface than the first SMT tail portion.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, and composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A board edge electrical connector, comprising:
   an insulating housing, including:
   a front surface serving as a mating end located at a front of the insulating housing;
   a bottom surface serving as a mounting end;
   a board edge receiving slot having an opening toward the mating end; and
   a supporting portion;
   a plurality of terminal groups retained in the insulating housing, each of the terminal groups including a plurality of terminals, the terminals of the each of the terminal groups arranged in a row extending in a left to right direction, each of the terminals including:
   a holding portion;
   a resilient contact portion extending from the holding portion and into the board edge receiving slot; and
   a tail portion extending from the holding portion to and out of the mounting end; and
   a connecting portion between the holding portion and the tail portion;
   wherein the terminal of at least one of the terminal groups has a longer connecting portion than the rest of the terminal groups, the longer connecting portion including a supported portion extending in a front and back direction,
   wherein the supporting portion includes a plurality of supporting grooves disposed thereon, and wherein the supported portion of the terminal is disposed on and supported by the supporting grooves,
   wherein the terminal groups include a first terminal group, a second terminal group, a third terminal group and a fourth terminal group,
   wherein the first terminal group is in front of the second terminal group in the front and back direction,
   wherein the third terminal group superposes the second terminal group,
   wherein the fourth terminal group superposes the third terminal group,
   wherein the resilient contact portions of the terminals of the first terminal group and the fourth terminal group are at the front of the board edge receiving slot, and face opposed to each other in an up and down direction,
   wherein the resilient contact portions of the terminals of the second terminal group and the third terminal group are at a back of the board edge receiving slot, and face opposed to each other in the up and down direction,
   wherein the tail portions of the terminals of the first terminal group, the second terminal group, the third terminal group and the fourth terminal group are arranged in order from the front to the back of the mounting end.

2. The board edge electrical connector of claim 1, wherein each of the supporting grooves includes a projection rib, at a rear end of the supporting groove, configured to support the supported portion of the terminal.

3. The board edge electrical connector of claim 1, wherein the terminals of the third terminal group and the fourth terminal group include the longer connecting portion including the supported portion, wherein the supporting portion is a first supporting portion, and the insulating housing further includes a second supporting portion, wherein the first supporting portion and the second supporting portion are configured to support the supported portions of the terminals of the third terminal group and the fourth terminal group.

4. The board edge electrical connector of claim 3, wherein each of the first terminal group, the second terminal group, the third terminal group and the fourth terminal group includes an insulating member, and wherein the holding portion of the terminals of the each of the first terminal group, the second terminal group, the third terminal group and the fourth terminal group is insert molded in the insulating member.

5. The board edge electrical connector of claim 4, wherein the insulating housing includes an upper housing and a lower housing installed and fixed to each other, wherein the insulating member of the first terminal group is fixed to the lower housing, wherein the insulating member of the second terminal group is fixed to the lower housing and at the back of the first terminal group, wherein the insulating member of the third terminal group superposes the insulating member of the second terminal group and is fixed to the lower housing, wherein the insulating member of the fourth terminal group is fixed to the upper housing and superposes the insulating member of the third terminal group.

6. The board edge electrical connector of claim 5, wherein the insulating member of the first terminal group is a first insulating member, the insulating member of the second terminal group is a second insulating member, the insulating member of the third terminal group is a third insulating member and the insulating member of the fourth terminal group is a fourth insulating member, wherein the lower housing includes a receiving portion including a first post hole, wherein the first insulating member includes a first heat stake post, the first insulating member being fixed to the receiving portion via a combination of the first post hole and the first heat stake post, wherein the lower housing includes a raised portion including a second post hole and a third post hole, wherein the second insulating member includes a second heat stake post and a second hole, the second insulating member being fixed to the raised portion via a combination of the second post hole and the second heat stake post, wherein the third insulating member includes a third heat stake post, and the third insulating member is fixed to the second insulating member and the raised portion via the second hole of the second insulating member and the third post hole of the raised portion.

7. The board edge electrical connector of claim 6, wherein the second insulating member includes a second positioning recess, and the third insulating member includes a third positioning block, wherein the third insulating member aligns to the second insulating member by aligning the third positioning block to the second positioning recess.

8. The board edge electrical connector of claim 7, wherein the third insulating member further includes a third positioning hole, and the fourth insulating member includes a fourth positioning block, wherein the fourth insulating member aligns to the third insulating member by aligning the fourth position block to the third position hole.

9. The board edge electrical connector of claim 8, wherein the upper housing includes an upper post hole, and the fourth insulating member including a fourth stake post, wherein the fourth insulating member is fixed to the upper housing via a combination of the upper post hole and the fourth stake post.

10. The board edge electrical connector of claims 1, wherein the tail portion includes a surface mounting technology (SMT) tail portion.

11. A board edge electrical connector, comprising:
an insulating housing, including:
a front surface serving as a mating end located at a front of the insulating housing;
a bottom surface serving as a mounting end;
a board edge receiving slot having an opening toward the mating end; and
a supporting portion;
a plurality of terminal groups retained in the insulating housing, each of the terminal groups including a plurality of terminals, the terminals of the each of the terminal groups arranged in a row extending in a left to right direction, the terminal including:
a holding portion;
a resilient contact portion extending from the holding portion and into the board edge receiving slot; and
a tail portion extending from the holding portion to and out of the mounting end; and
a connecting portion between the holding portion and the tail portion,
wherein at least one of the terminal groups serves as a high frequency terminal group configured to transmit a high frequency signal, and at least one of the terminal groups serves as a low frequency terminal group configured to transmit a non-high frequency signal,
wherein the high frequency terminal group includes a plurality of differential pairs of signal terminals, and a plurality of ground terminals,
wherein the differential pairs and the ground terminals are arranged in an alternating manner,
wherein the resilient contact portions of the high frequency terminal group are arranged in a pattern of GGSSGG, where a portion which transmits a reference ground is indicated by G, and a portion which transmits the high frequency signal is indicated by S,
wherein the terminal groups include a first terminal group, a second terminal group, a third terminal group and a fourth terminal group, wherein two of the terminal groups serve as the high frequency terminal groups, and the other two of the terminal groups serve as the low frequency terminal groups,
wherein the first terminal group is in front of the second terminal group in a front and back direction, wherein the first terminal group and the second terminal group are closer to the mounting end than the third terminal group and the fourth terminal group,
wherein the third terminal group superposes the second terminal group,
wherein the fourth terminal group superposes the third terminal group,
wherein the resilient contact portions of the terminals of the first terminal group and the fourth terminal group are at the front of the board edge receiving slot, and face opposed to each other in an up and down direction,
wherein the resilient contact portions of the terminals of the first terminal group are below the resilient contact portions of the terminals of the fourth terminal group, wherein the resilient contact portions of the terminals of the second terminal group and the third terminal group are at a back of the board edge receiving slot, and face opposed to each other in the up and down direction, wherein the resilient contact portions of the terminals of the second terminal group are below the resilient contact portions of the terminals of the third terminal group, wherein the first terminal group and the second terminal group serve as the high frequency terminal groups, and the third terminal group and the fourth terminal group serve as the low frequency groups.

12. The board edge electrical connector of claim 11, wherein the holding portion of each of the ground terminals is wider than that of the signal terminals, two resilient contact portions and two tail portions extend from the holding portion of the ground terminal.

13. The board edge electrical connector of claim 12, wherein the tail portions of the high frequency terminal group are arranged in the pattern.

14. A board edge electrical connector, comprising:
an insulating housing, including:
a front surface serving as a mating end of the board edge connector;
a back surface opposite to the front surface;
a top surface;
a bottom surface, opposite to the top surface, serving as a mounting end of the board edge connector;
a board edge receiving slot having an opening toward the mating end; and
a first supporting portion including a plurality of first supporting grooves;
a first terminal group, retained in the insulating housing, including a plurality of first terminals arranged in a row extending in a left to right direction, the first terminal including:
a first resilient contact portion extending into the board edge receiving slot; and
a first surface mounting technology (SMT) tail portion;
a second terminal group, retained in the insulating housing, including a plurality of second terminals arranged in a row extending in the left to right direction, the second terminal including:
a second resilient contact portion extending into the board edge receiving slot; and
a second SMT tail portion;
a third terminal group, retained in the insulating housing, including a plurality of third terminals arranged in a row extending in the left to right direction, the third terminal including;
a third holding portion;
a third resilient contact portion extending from the holding portion and into the board edge receiving slot;
a third SMT tail portion; and
a third connecting portion configured to connect the third holding portion to the third SMT tail portion; and a fourth terminal group, retained in the insulating housing, including a plurality of fourth terminals arranged in a row extending in the left to right direction, the fourth terminal including:
a fourth holding portion;
a fourth resilient contact portion extending from the fourth holding portion and into the board edge receiving slot;
a fourth SMT tail portion; and
a fourth connecting portion configured to connect the fourth holding portion to the fourth SMT tail portion,
wherein at least one of the third connecting portion and the fourth connecting portion includes a supported portion, the supported portion extending in a front and back direction, the supported portion being on and supported by the first supporting grooves,
wherein the first resilient contact portion and the fourth resilient contact portion are closer to the front surface than the second resilient contact portion and the third resilient contact portion,
wherein the first SMT tail portion, the second SMT tail portion, the third SMT tail portion and the fourth SMT tail portion extend out of the mounting end,
wherein the fourth SMT tail portion is closer to the back surface than the first SMT tail portion, the second SMT tail portion and the third SMT tail portion, wherein the third SMT tail portion is closer to the back surface than the first SMT tail portion and the second SMT tail portion, and wherein the second SMT tail portion is closer to the back surface than the first SMT tail portion.

15. The board edge electrical connector of claim 14, wherein each of the first supporting grooves includes a projection rib at a rear end of the first supporting groove, wherein the projection rib is configured to support the supported portion.

16. The board edge electrical connector of claims 14, wherein the first terminal group is in front of the second terminal group in the front and back direction, wherein the third terminal group superposes the second terminal group in an up and down direction, wherein the fourth terminal group superposes the third terminal group in the up and down direction,
wherein the first resilient contact portion and the fourth resilient contact portion face opposed to each other in the up and down direction,
wherein the second resilient contact portion and the third resilient contact portion face opposed to each other in the up and down direction.

17. The board edge electrical connector of claim 14, wherein the insulating housing further includes a second supporting portion including a second supporting groove,
wherein the third connecting portion includes a third supported portion which is supported by the first supporting groove, and
wherein the fourth connecting portion includes a fourth supported portion which is supported by the second supporting groove.

* * * * *